United States Patent
Brackley et al.

(10) Patent No.: US 11,425,826 B2
(45) Date of Patent: Aug. 23, 2022

(54) TILED DISPLAYS AND METHODS OF MANUFACTURING THE SAME

(71) Applicant: CORNING INCORPORATED, Corning, NY (US)

(72) Inventors: Douglas Edward Brackley, Horseheads, NY (US); Alexander Lee Cuno, Sayre, PA (US); Scott Winfield Deming, Elmira, NY (US); Sean Matthew Garner, Elmira, NY (US); Gregory Scott Glaesemann, Corning, NY (US); Garrett Andrew Piech, Corning, NY (US)

(73) Assignee: Corning Incorporated, Corning, NY (US)

( * ) Notice: Subject to any disclaimer, the term of this patent is extended or adjusted under 35 U.S.C. 154(b) by 378 days.

(21) Appl. No.: 16/630,206

(22) PCT Filed: Jul. 5, 2018

(86) PCT No.: PCT/US2018/040845
§ 371 (c)(1),
(2) Date: Jan. 10, 2020

(87) PCT Pub. No.: WO2019/014036
PCT Pub. Date: Jan. 17, 2019

(65) Prior Publication Data
US 2020/0163233 A1     May 21, 2020

Related U.S. Application Data

(60) Provisional application No. 62/531,110, filed on Jul. 11, 2017.

(51) Int. Cl.
*H05K 5/00* (2006.01)
*G02F 1/1333* (2006.01)
(Continued)

(52) U.S. Cl.
CPC ....... *H05K 5/0017* (2013.01); *G02F 1/13336* (2013.01); *H01L 23/544* (2013.01);
(Continued)

(58) Field of Classification Search
CPC ........ F21V 21/005; F21V 21/14; G09F 13/00; G09F 15/0068; G09F 9/3026; G09F 9/33;
(Continued)

(56) References Cited

U.S. PATENT DOCUMENTS 6,133,969 A    10/2000   Babuka et al.
6,509,941 B2    1/2003   Freidhoff et al.
(Continued)

FOREIGN PATENT DOCUMENTS

CN    101673009 B    1/2011
CN    202838861 U    3/2013
(Continued)

OTHER PUBLICATIONS

Ebert et la; "Tiled++ An Enhanced Tiled Hi-Res Display Wall"; IEEE Transactions on Visualization and Computer Graphics; V16, No. 1, pp. 120-132, 2010, DOI: 10.1109/TVCG.2009.57.
(Continued)

*Primary Examiner* — Nelson M Rosario
(74) *Attorney, Agent, or Firm* — Ryan T. Hardee

(57) ABSTRACT

A tiled display having pixels arranged in rows and columns, and including first and second tiles. The tiles comprise a substrate carrying a matrix of pixels arranged at a pixel pitch. The substrates comprise an edge extending between opposing faces in a depth direction. The substrate edges have a complementary shape, and face one another to establish a seam. The pixel pitch is maintained across the seam. Pixels of the second tile are not interposed between pixels of the first tile. The complementary shape includes a segment of the seam being oblique to the pixel rows, or the
(Continued)

substrate edge of the first tile profiled in the depth direction whereby at least a section of the edge is non-perpendicular to the faces. The tiled display can maintain the pixel pitch at the seams at high resolutions (e.g., pixel pitch less than 0.5 mm).

53 Claims, 10 Drawing Sheets

(51) Int. Cl.
     *H01L 23/544*       (2006.01)
     *H01L 25/075*       (2006.01)

(52) U.S. Cl.
     CPC ....... *H01L 25/0753* (2013.01); *H05K 5/0021* (2013.01); *G02F 1/133354* (2021.01); *H01L 2223/54426* (2013.01)

(58) Field of Classification Search
     CPC ...... G09F 13/04; G09F 13/14; F16B 2200/30; F21Y 2113/13; F21Y 2115/10; Y10T 29/49826; Y10T 29/49959; Y10T 403/72; Y10T 403/725; G02F 1/13336; G02F 1/33; G02F 1/133354; G02F 1/1333; G02F 1/13; H01L 23/544; H01L 25/0753; H01L 27/3293; H01L 2223/54426; H05K 5/0017; H05K 5/0021; G06F 1/1637; G06F 3/041

See application file for complete search history.

(56) References Cited

U.S. PATENT DOCUMENTS

| | | | |
|---|---|---|---|
| 6,870,519 B2 | 3/2005 | Sundahl | |
| 6,881,946 B2 | 4/2005 | Cok et al. | |
| 7,205,729 B2 | 4/2007 | Thielemans et al. | |
| 7,362,046 B2 | 4/2008 | Aston | |
| 7,408,296 B2 | 8/2008 | Cok et al. | |
| 7,474,275 B2 | 1/2009 | Sundahl | |
| RE41,603 E | 8/2010 | Matthies et al. | |
| 3,120,596 A1 | 2/2012 | Popovich et al. | |
| 8,493,284 B2 | 7/2013 | Hajjar | |
| 8,537,302 B2 | 9/2013 | Dunn | |
| 8,593,061 B2 | 11/2013 | Kamada | |
| 8,634,042 B2 | 1/2014 | Park | |
| 8,976,081 B2 | 3/2015 | Rao et al. | |
| 9,053,648 B1 | 6/2015 | Lee et al. | |
| 9,146,400 B1 | 9/2015 | Lee et al. | |
| 9,164,722 B2 | 10/2015 | Hall | |
| 9,326,620 B1 | 5/2016 | Cross et al. | |
| 10,293,436 B2 | 5/2019 | Marjanovic et al. | |
| 2001/0046007 A1 | 11/2001 | Greene et al. | |
| 2004/0031226 A1 | 2/2004 | Miller et al. | |
| 2007/0227025 A1 | 10/2007 | Venture | |
| 2009/0073080 A1 | 3/2009 | Meersman et al. | |
| 2011/0215990 A1 | 9/2011 | Liesenberg | |
| 2012/0159819 A1 | 6/2012 | Patterson et al. | |
| 2014/0168032 A1 | 6/2014 | Swan et al. | |
| 2014/0199519 A1 | 7/2014 | Schillinger et al. | |
| 2015/0022424 A1 | 1/2015 | Jepsen | |
| 2015/0153995 A1 | 6/2015 | Durtis et al. | |
| 2015/0286457 A1 | 10/2015 | Kim et al. | |
| 2016/0010836 A1 | 1/2016 | Patterson et al. | |
| 2016/0035924 A1 | 2/2016 | Oraw et al. | |
| 2016/0045953 A1 | 2/2016 | Park et al. | |
| 2016/0224068 A1 | 8/2016 | Choi et al. | |
| 2016/0267821 A1 | 9/2016 | Cross et al. | |
| 2017/0008122 A1 | 1/2017 | Wieland et al. | |
| 2017/0359916 A1* | 12/2017 | Hochman | H05K 7/1452 |

FOREIGN PATENT DOCUMENTS

| | | |
|---|---|---|
| EP | 1449192 A1 | 8/2004 |
| EP | 1650729 A2 | 4/2006 |
| GB | 2531558 A | 4/2016 |
| JP | 2005017738 A | 1/2005 |
| JP | 2008225131 A | 9/2008 |
| KR | 2009058984 A | 6/2009 |
| KR | 10-1018784 B1 | 3/2011 |
| KR | 101127960 B1 | 3/2012 |
| KR | 1157425 B1 | 6/2012 |
| KR | 2014071796 A | 6/2014 |
| WO | 03/42966 A1 | 5/2003 |

OTHER PUBLICATIONS

Greenfield et al; "A Lamination Study of a Composite LCD Flat Panel Display"; IEEE, 2002 Inter Society Conference on Thermal Phenomena; pp. 1001-1006, 2002, DOI: 10.1109/ITHERM.2002. 1012566.

International Search Report and Written Opinion of the International Searching Authority; PCT/US2018/040845; dated Nov. 9, 2018; 14 Pages; ISA/US Commissioner for Patents.

* cited by examiner

TILED DISPLAYS AND METHODS OF MANUFACTURING THE SAME

CROSS-REFERENCE TO RELATED APPLICATIONS

This application is a national stage entry of International Patent Application Serial No. PCT/US2018/040845, filed on Jul. 5, 2018, which in turn, claims the benefit of priority under 35 U.S.C. § 119 of U.S. Provisional Application Ser. No. 62/531,110 filed on Jul. 11, 2017, the contents of each of which are relied upon and incorporated herein by reference in their entireties.

BACKGROUND

Field

The present disclosure generally relates to large format displays. More particularly, it relates to tiled displays including two or more display tiles and methods for forming a tiled display from two or more display tiles.

Technical Background

A number of display technologies have achieved current-day marketplace success, such as liquid crystal displays (LCD), light emitting diode (LED) backlit LCDs, LED displays, organic light emitting diode (OLED) displays, e-paper displays, etc. Manufacturers within each display technology area have invested greatly in the mass production of the corresponding displays at certain form factors or sizes that have achieved wide-spread consumer acceptance. Some end user applications, however, entail a desired display area much larger than the display size(s) conventionally available for the particular display technology. While it is of course possible for a manufacturer to create a single, large-area display, there is a dramatic increase in the cost of production (as compared to costs associated with producing conventional form factors or sizes). For example, because the size of a desired large-area display may be much larger than the handling capabilities of existing production equipment, expensive alterations to the equipment or even new, specialized equipment can be required. Further, the yield of large display sizes is much lower than smaller display panel yield.

In light of the above, a well-accepted, cost-effective approach for creating a large-area display is to position or assemble two or more small format displays in close proximity to one another, giving the appearance of a large-area display. This technique is commonly referred to as "tiling," and the individual, smaller-format displays are referred to as "tiles" that combine to generate a large-area, tiled display. Conventionally, and regardless of the display technology employed, rectangular tiles or panels are arranged in an array to create a tiled display, with an edge of each tile in close proximity to and facing an edge of a neighboring tile. The region or area of interface between the edges of neighboring tiles is oftentimes referred to as a "seam". The visual appearance of an image generated by a tiled display can be negatively affected by deviations in pixel pitch across the seam. As a point of reference, each tile of the tiled display includes or carries a matrix of pixels or pixel elements (as generated by the particular display technology) arranged in columns and rows; the pixels are uniformly spaced from one another (center-to-center) in both the column direction and the row direction, with this between-pixel spacing or distance designated as the "pitch" or "pixel pitch" (with pixel pitch being analogous to display resolution). The pixel pitch associated with the rows may be different from the pixel pitch of the columns. Pixel pitch can alternatively be defined along other linear directions in the display. While each tile of the tiled display will have an identical pixel pitch, if this same pixel pitch is not maintained across the seam, the seam will be visible and degrade the image. For example, if the uniform pixel pitch of two neighboring tiles forming a seam is 0.8 mm and the distance between immediately adjacent pixels at opposite sides of the seam is 3 mm, a "break" in the combined image generated by the tiles at the seam will be visually noticeable (especially at closer distances). Additionally, if neighboring tiles (and thus the corresponding pixel row(s) or column(s)) are mis-registered relative to one another, quality of the combined image will suffer (e.g., a visually perceptible "shift" in the combined image may appear at the seam).

The likelihood of pixel pitch deviation across the seam and/or errors in tile-to-tile registration is largely a function of the display technology involved, and the desire to address such concerns depends upon the end use application. For example, conventional LCD technology can provide a pixel pitch on the order of 0.25 mm, and a frame or bezel surrounds the available display area of the display itself. In many instances, due to the presence of the bezel (and other inherent technology limitations), it is exceedingly difficult to arrange the rectangular, flat edged panels so as to locate pixels at opposite sides of the seam within 0.25 mm of one another. Under circumstances where visually perceptible image degradation in the large-area, tiled LCD display is unacceptable (e.g., close in view), optical enhancement articles may be applied over or to the seams. Conversely, current LED display technology provides a pixel pitch on the order of 1 mm. It is possible to maintain this pixel pitch across a seam of a tiled LED display by abutting the printed circuit board of neighboring LED tiles against one another. While seam visibility is of less concern with tiled LED displays, the corresponding resolution may not be satisfactory for the particular end use application.

High resolution tiled displays exits, but tile seams are highly visible (e.g., tiled LCD displays). On the other hand, tiled displays with no apparent tile seams are available, but the resolution is comparatively low (e.g., tiled LED displays). Further, with conventional tiling techniques incorporating an array of identically sized and shaped rectangular tiles results in continuous seams running the entire length and width of the tiled display; these continuous seams can give rise to mechanical stability problems, allowing the tiles to more easily move relative to one another over time.

Accordingly, tiled displays, tiles for creating a tiled display, and methods of assembling tiled displays, are disclosed herein.

SUMMARY

Some embodiments of the present disclosure relate to a tiled display. The tiled display has an array of pixels arranged in a plurality of rows and a plurality of columns. The tiled display comprises first and second tiles. The first tile comprises a substrate carrying a matrix of pixels arranged at a uniform pixel pitch along a defined linear direction. The substrate comprises opposing major faces and an edge extending between the major faces in a depth direction of the substrate. The matrix of pixels includes a first pixel most proximate the first edge. The second tile also comprises a substrate carrying a matrix of pixels arranged at the uniform pixel pitch along a defined linear direction. The substrate of the second tile comprises an edge extending between opposing major faces in a depth direction. The substrate edge of the first tile and the substrate edge of the second tile have a complementary shape. Further, final assembly of the tiled display includes the substrate edges of the first and second tiles face one another to establish a seam there between. The pixels of the first tile are registered with pixels of the second tile and the uniform pixel pitch is maintained across the seam along a defined linear direction. The first pixel of the first tile is aligned with a first row and with a first column of the array of pixels. Further, the pixels of the second tile are not interposed between pixels of the first tile at least along the first row and the first column. Finally, the complementary shape of the substrate edges includes at least one of a segment of the seam being oblique to the rows of the pixel array, or the substrate edge of the first tile is profiled in the depth direction such that at least a section of the edge is non-perpendicular to a plane of the corresponding, opposing major faces. With this construction, the tiled display maintains the uniform pixel pitch at the tile seams along a defined linear direction and tile-to-tile registration at high resolutions (e.g., pixel pitch of not greater than 0.5 mm). In some embodiments, the tiles incorporate a micro-LED display technology, with each of the pixels comprises one or more micro-LEDs. In other embodiments, the tiles can incorporate any other display technology currently known or in the future developed (e.g., LCD, OLED, LED, e-paper, etc.). In some embodiments, the substrate edge of one or more of the tiles has a non-linear shape, with the extent of the non-linear shape being less than the pixel pitch. In some embodiments, the substrate edge profile in the depth direction comprises a stepped shape.

Yet other embodiments of the present disclosure relate to methods of assembling a tiled display. A first tile is placed on a reference surface. The first tile includes a substrate carrying a matrix of pixels arranged at a uniform pixel pitch along a defined linear direction, and an alignment feature provided apart from any perimeter edge of the first tile. A second tile is placed on the reference surface. The second tile includes a substrate carrying a matrix of pixels arranged at the uniform pixel pitch along a defined linear direction, and an alignment feature provided apart from any perimeter edge of the second tile. At least the second tile is manipulated relative to the first tile along the reference surface such that an edge of the first tile faces an edge of the second tile to establish a seam. The alignment feature of the first tile is aligned with the alignment feature of the second tile such that the pixels of the first tile are registered with the pixels of the second tile. Following the step of aligning, the uniform pixel pitch is maintained across the seam. With these and related methods, pixels between neighboring tiles are directly aligned without relying on edge-to-edge contact between the tiles. The alignment features can, in some embodiments, comprise a pixel element (e.g., a micro-LED), thin-film transistor (TFT) or electronic interconnect patterning, patterned registration marks, etc. Alignment of neighboring tiles can be based on features that have been placed or created on a substrate of the tiles with precision, and does not rely on edge or position or shape variation.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate various embodiments described herein, and together with the description serve to explain the principles and operations of the claimed subject matter.

DETAILED DESCRIPTION

Figure 1:
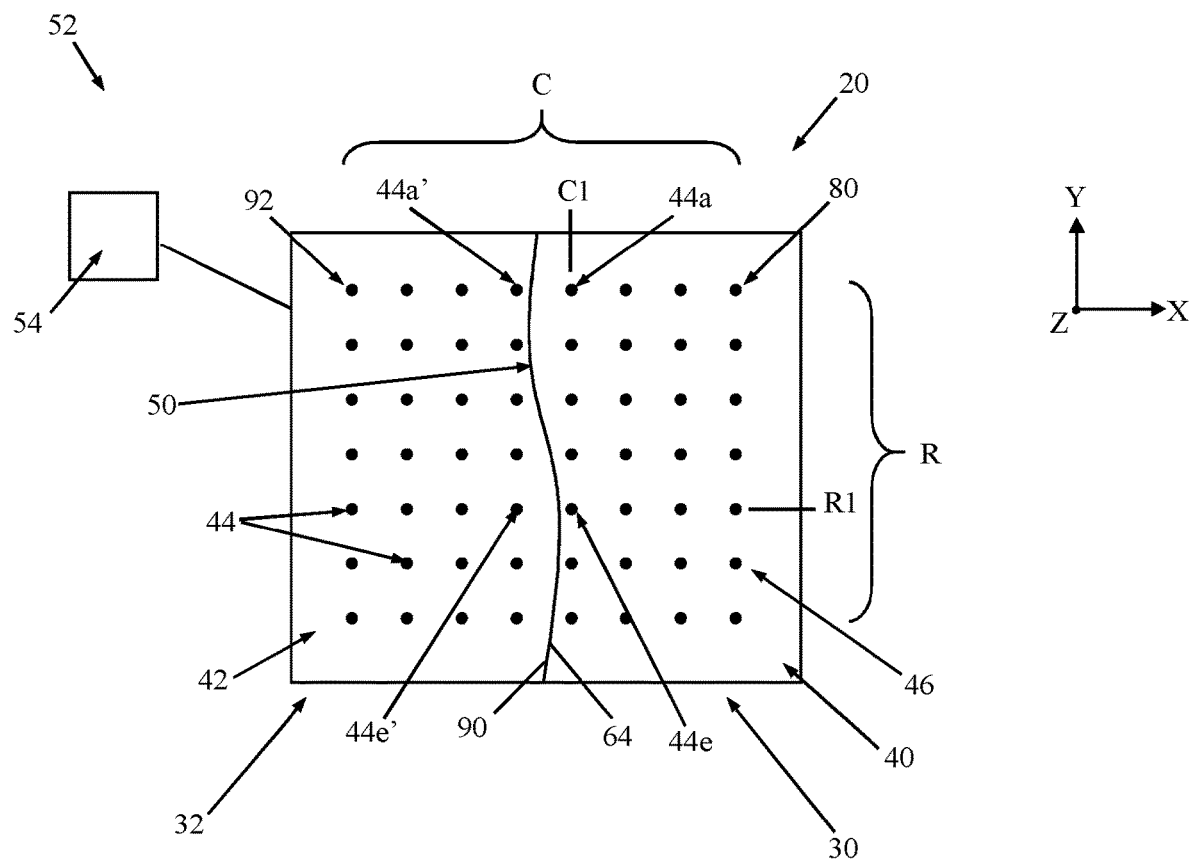
FIG. 1 is a schematic diagram of a display device including a simplified front plan view of a tiled display in accordance with principles of the present disclosure.

Reference will now be made in detail to various embodiments of tiled displays, methods of manufacturing tiled displays, and tiles for use with tiled displays. The overall tiled displays of the present disclosure can have at least one linear dimension of not less than 0.1 m, alternatively not less than 0.5 m, alternatively not less than 1 m, alternatively not less than 2 m, alternatively not less than 5 m, and alternatively not less than 10 m. Whenever possible, the same reference numerals will be used throughout the drawings to refer to the same or like parts.

One embodiment of a tiled display 20 in accordance with principles of the present disclosure is shown in simplified form in FIG. 1. The tiled displays of the present disclosure generally include two or more tiles, such as first and second tiles 30, 32 identified in FIG. 1. As described in greater detail below, each of the tiles 30, 32 includes a substrate 40, 42, respectively, carrying one or more pixels or pixel elements 44. The tiles 30, 32 are arranged relative to one another such that upon final assembly of the tiled display 20, a pixel array 46 is formed, with the pixels 44 of the array 46 collectively being arranged or aligned in two linear directions, such as a plurality of rows R and a plurality of columns C that are perpendicular to the rows R. Alternatively, a pixel array can be defined by other linear directions, such as a plurality of rows and a plurality of diagonals, where the diagonals are not perpendicular to the rows. A pixel pitch is established by the array 46, where "pixel pitch" is defined as the nominal or mean center-to-center distance between neighboring or immediately adjacent pixels 44 in a designated linear direction of the array 46 (e.g., nominal or mean center-to-center distance between all pairs of neighboring pixels 44 in a direction of (or along) each of the rows R, or nominal or mean center-to-center distance between all pairs of neighboring pixels 44 in a direction of (or along) each of the columns C). It will be understood that the actual center-to-center distance between any particular pair of neighboring pixels 44 within the designated linear direction may deviate or vary slightly from the designated pixel pitch; however, the array 46 is characterized as having a uniform pixel pitch, where "uniform pixel pitch" is defined as the center-to-center distance between any particular pair of neighboring pixels 44 in the designated linear direction deviating or varying by no more than 50% from the designated pixel pitch (i.e., from the nominal or mean pixel pitch of all pairs of neighboring pixels 44 in the designated linear direction), alternatively not more than 40%, alternatively not more than 30%, alternatively not more than 20%, alternatively not more than 10%, alternatively not more than 5%, and in some embodiments not more than 1%. In some embodiments of the present disclosure, the substrates 40, 42 incorporate one or more complementary features that promote the pixel pitch being maintained across a seam 50 formed between the tiles 30, 32, or desired tile-to-tile registration (e.g., a registration error of not greater than 50% of the pixel pitch, alternatively not greater than 40%, alternatively not greater than 30%, alternatively not greater than 20%, alternatively not greater than 10%, alternatively not greater than 5%, and in some embodiments not greater than 1%), or both. For example, the complementary feature(s) can include the substrates 40, 42 being shaped in a manner that forms at least a segment the seam 50 to be oblique to a direction of the rows R and/or the edge(s) of one or both of the substrates 40, 42 being profiled in the depth (Z) direction. As a point of reference, the tiled display 20 can be part of a display device 52 that further includes a controller 54 electronically connected to each of the tiles 30, 32 and programmed to drive operation of the tiles 30, 32 in displaying coordinated images as is known in the art.

The tiles of the present disclosure can incorporate any display technology currently known or in the future developed, such as, for example phosphorescent, electroluminescent, organic or inorganic emissive, transmissive, reflective or other known technologies. Thus, the pixels 44 of each of the tiles 30, 32 can be provided by, for example, micro-LEDs, LCD, OLEDs, LEDs, e-paper, etc. A combination of display technologies can alternatively be employed, such as a tiled micro-LED backlight used within an LCD device. With this non-limiting example, the pixel pitch of the micro-LED backlight array may be different from the pixel pitch of the combined LCD. It will be understood that in digital imaging, a pixel is a physical point in a raster image, or the smallest addressable display element in a display device; in other words, a pixel is the smallest controllable element of an image or picture represented on the display. The address of a pixel corresponds to its physical coordinates. With some display technologies, such as LED and micro-LED, the pixel 44 can in actuality be a surface-mounted lamp composed of three (or more) "sub-pixels," each of which is an individual LED (or micro-LED) comprising red, green and blue elements (e.g., diodes or color conversion). With other display technologies, such as LCD, each pixel consists of a layer of molecules aligned between two transparent electrodes, along with polarizing filters and color filters that create red, green and blue sub-pixels. In some embodiments, the nominal value of the pixel pitch of the tiles of the present disclosure (such as the tiles 30, 32), and thus of the tiled display 20, is not greater than 1.0 mm, alternatively not greater than 0.5 mm, alternatively not greater than 0.4 mm, alternatively not greater than 0.3 mm, alternatively no greater than 0.2 mm and in some embodiments is not greater than 0.1 mm (such as with some micro-LED display technologies). Where an emitting display technology is employed, the tiles 30, 32 can have either a top emission or bottom emission format. Also, the tiles 30, 32 can have either top emitting or bottom emitting regions or intermingled arrays.

With the above in mind, the substrate 40, 42 provided with each of the tiles 30, 32 can assume various forms and serve various functions depending upon the particular display technology employed. For example, in some embodiments, the substrate 40, 42 can provide a surface to which pixel elements (e.g., LEDs, micro-LEDs, etc.) are mounted or attached. In other embodiments, the substrate 40, 42 can be a requisite sub-component of the display technology build-up (e.g., a typical LCD display technology build-up includes a front plate, a crystal layer, a back plate, a polarizer, a light spreader and a back light source; with these non-limiting examples, the substrate 40, 42 can be configured and formatted to serve as (or as part of) the front plate, the back plate or the back light source and other sub-components not tiled in the same manner or not at all). Alternatively, the substrate 40, 42 can be the support layer of a thin-film transistor (TFT) component useful with the particular display technology (e.g., LCD). In yet other embodiments, the substrate 40, 42 can be a cover plate, can be a component added to the conventional construction of the display technology being employed, etc. With these general explanations in mind, in some embodiments the substrate 40, 42 can be a single, multi-layer, or composite structure with at least one material being glass, glass ceramic or ceramic. The substrate 40 can be transparent, scattering or opaque in accordance with the particular display technology. In some embodiments, the substrate is configured to be dimensionally stable, for example exhibiting a coefficient of thermal expansion (CTE) of not greater than 10 ppm/° C., alternatively not greater than 8 ppm/° C., alternatively not greater than 6 ppm/° C., and alternatively not greater than 4 ppm/° C. Optionally, a Young's modulus of the substrate 40, 42 is not less than 50 GPa, alternatively not less than 60 GPa, and alternatively not less than 70 GPa. The optional dimensional stability of the substrate 40 can alternatively be characterized as by the substrate 40 being configured to experience low dimensional change in the presence of water or solvent (i.e., the substrate experiences a dimensional change of less than 10% in the presence of water or solvent). In some embodiments, the substrate 40, 42 has a thickness of not greater than 2 mm, alternatively not greater than 1 mm, alternatively not greater than 0.7 mm, alternatively not greater than 0.5 mm, alternatively not greater than 0.3 mm, and alternatively not greater than 0.2 mm. The substrates 40, 42 can each have at least one linear dimension of not less than 0.05 m, alternatively not less than 0.1 m, alternatively not less than 0.5 m, and in other embodiments not less than 1 m. In some embodiments, and depending upon the display technology application requirements, a composition of the substrate 40, 42 can be substantially alkali-free (i.e., no more than 1% alkali) or can be alkali-containing so as to be, for example, compatible with some TFT fabrication or ion-exchange processes, respectively.

Substrate Shape

Figure 2A:
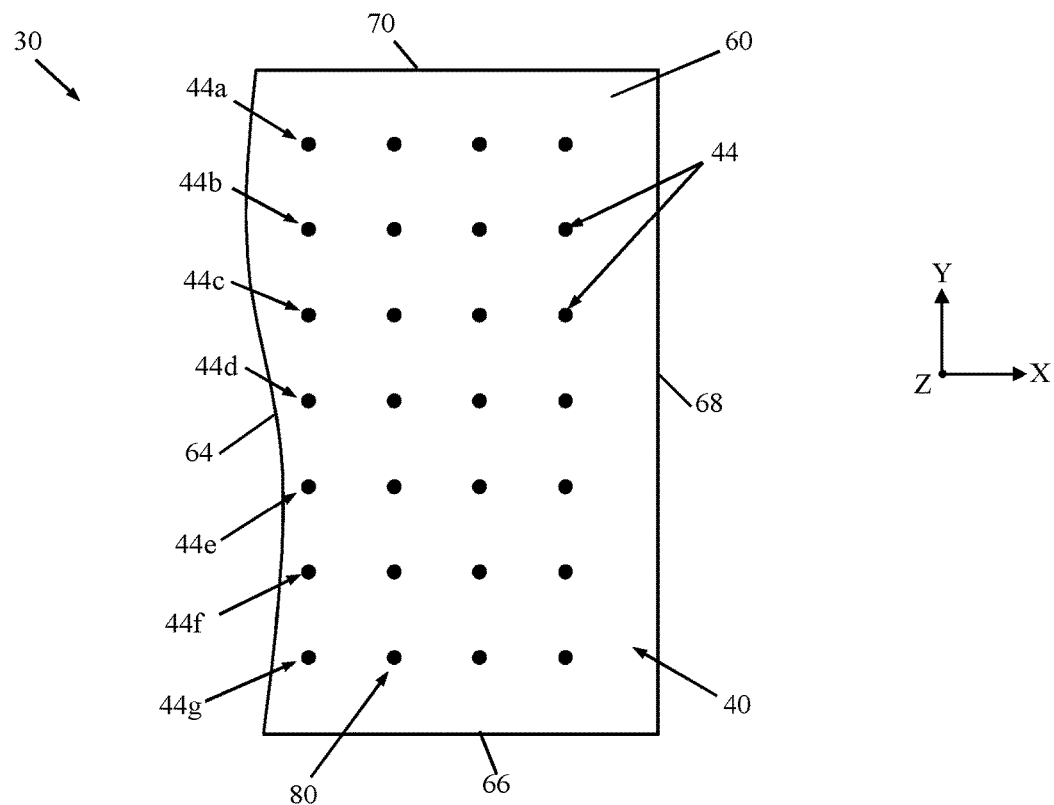
FIG. 2A is an enlarged, simplified front plan view of a tile of the tiled display of FIG. 1.
Figure 2B:
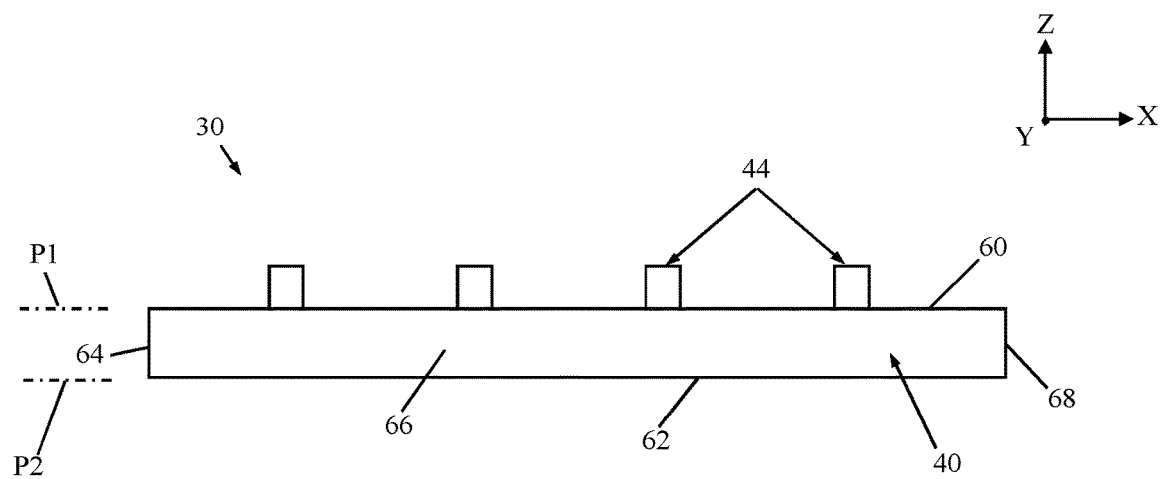
FIG. 2B is an enlarged, simplified side view of the tile of FIG. 2A.

As mentioned above, in some embodiments, two or more of the tiles comprising the tiled display (such as the tiles 30, 32) can incorporate complementary-shaped substrates (such as the substrates 40, 42) and pixel arrangements that promote maintaining the uniform pixel pitch across the seam 50 and/or tile-to-tile registration with an error of not greater than 50% of the pixel pitch, alternatively not greater than 40%, alternatively not greater than 30%, alternatively not greater than 20%, alternatively not greater than 10%, alternatively not greater than 5%, and in some embodiments not greater than 1%. By way of further reference, FIGS. 2A and 2B illustrate the first tile 30 in isolation, along with the coordinate system of FIG. 1. The non-limiting embodiment of FIGS. 2A and 2B can be akin to a possible micro-LED display technology construction, with each of the pixels 44 defined by one (or more) micro-LEDs. The pixels 44 are arranged on a surface of the substrate 40, with the substrate 40 defining an outermost boundary or perimeter of the tile 30. It will be understood that the tile 30 can include one or more additional components appropriate for operating the pixels 44 in a desired manner, such as circuitry traces or connectors (that may or may not be formed on, in or through the substrate 40), a cover sheet, polarizers, etc. Regardless, the substrate 40 can be viewed as defining opposing, first and second major faces 60, 62. One or both of the major faces 60, 62 can be substantially flat or planar (i.e., within 5% of a truly flat surface across the tile 30) in the X-Y (or display) plane, and edges of the substrate 40 extend between the major faces 60, 62 in the Z or depth direction. For example, first, second, third and fourth edges 64, 66, 68, 70 are identified in FIG. 2A, with the first, second and third edges 64, 66, 68 being visible in FIG. 2B. The pixels 44 can be located on the first major face 60, and are arranged in a matrix 80 having a uniform pixel pitch (i.e., the center-to-center distance between neighboring pixels 44 in a designation linear direction (e.g., the X direction and/or in the Y direction) is uniform across the matrix 80 as defined above). The pixel pitch in the X direction and the Y direction can be the same or different. In addition, the pixel matrix 80 can be defined by non-orthogonal linear directions such as the X direction and a diagonal.

The edges 64, 66, 68, 70 combine to define a shape (in the X-Y plane) of the substrate 40, and in some embodiments, at least a segment of at least one of the edges 64, 66, 68, 70 is non-linear. For example, with the non-limiting embodiment of FIG. 2A, the first edge 64 is non-linear (e.g., curved or wavy) in the X-Y plane, whereas the second, third, and fourth edges 66, 68, 70 are linear. With this construction, two or more of the pixels 44 of the matrix 80 most proximate the non-linear first edge 64 (e.g., the pixels identified at 44a-44g in FIG. 2A) are located at different distances from the first edge 64. For example, a distance between the first pixel 44a and the non-linear first edge 64 is greater than a distance between the fifth pixel 44e and the non-linear first edge 64. With some embodiments of the present disclosure, one or more of the pixels 44 can be located in highly close proximity to an edge of the substrate 40 (e.g., a distance or spacing of not greater than 0.3 mm, alternatively not greater than 0.2 mm, and alternatively not greater than 0.1 mm). Regardless, one or more other tiles of the tiled display 20 (FIG. 1) can incorporate features that complement the shape of the non-linear first edge 64 and a location of the pixels 44 of the matrix 80 relative to the non-linear first edge 64.

For example, and with additional reference to FIG. 1, the substrate 42 of the second tile 32 can be highly akin to the substrate 40 of the first tile 30 as described above. Upon final assembly of the tiled display 20, the first edge 64 of the substrate 40 of the first tile 30 faces a first edge 90 of the substrate 42 of the second tile 32 to generate the seam 50. The first edge 90 of the second tile substrate 42 has a non-linear shape in the X-Y plane that is complementary to or mimics the shape of the first edge 64 of the first tile substrate 40. Further, the pixels 44 of the second tile 32 are arranged in a matrix 92 having the same uniform pixel pitch as the first tile 30, and the matrix 92 is aligned relative to the first edge 90 in a manner corresponding with alignment of the pixel matrix 80 of the first tile 30 relative to the corresponding first edge 64 (it being understood that the first tile pixel matrix 80 and the second tile pixel matrix 92 combine to generate the pixel array 46 of the tiled display 20). With this construction, the complementary non-linear first edges 64, 90 facilitate ready, consistent placement and registration of the first and second tiles 30, 32 are relative to one another (e.g., the first edge 64 of the first tile substrate 40 readily "matches" or mates with the first edge 90 of the second tile substrate 42). The resultant seam 50 mimics the non-linear shape of the complementary first edges 64, 90. In this regard, the optional, non-linear shaped seam 50 can assume a wide variety of other shapes, and portions of the seam 50 can be linear. In more general terms, in some embodiments of the present disclosure, the seam 50 formed by the facing edges of neighboring tiles can be described as comprising at least a segment that is oblique to the plurality of rows R of the pixel array 46. In other embodiments, however, an entirety of the seam can be parallel or perpendicular to the rows R. In this non-limiting example, the tile edges 64, 90 may not or may not be in physical contact with one another.

The tiles 30, 32 are further constructed such that upon final assembly, the uniform pixel pitch of the tiles 30, 32 is maintained across the seam 50. In other words, a center-to-center spacing between aligned pixels at opposite sides of the seam 50 corresponds with (i.e., is within 10% of) the uniform pixel pitch established within the individual tiles 30, 32. Thus, for example, upon final assembly the first pixel 44a of the first tile 30 is aligned with a first pixel 44a' of the second tile 30, and the fifth pixel 44e of the first tile 30 is aligned with a fifth pixel 44e' of the second tile 32. While the distance between the first pixel 44a of the first tile 30 and the corresponding first edge 64 is greater than that of the fifth pixel 44e, the first and fifth pixels 44a', 44e' have an opposite relationship relative to the corresponding first edge 90. Thus, upon final assembly, the center-to-center distance between the neighboring first pixels 44a, 44a', otherwise at opposite sides of the seam 50, corresponds with or maintains the uniform pixel pitch, as does the center-to-center distance between the neighboring fifth pixels 44e, 44e'.

With embodiments in which two neighboring tiles of the tiled display include complementary, non-linear edges (such as with the non-limiting example tiles 30, 32 of FIG. 1), the corresponding substrates 40, 42 can be configured such that the non-linearity is contained within the pixel pitch spacing and does not produce inter-digitated pixels. That is to say, any non-linearity (or deviation from linear) in the first edges 64, 90 is less than the pixel pitch (nominal value or mean). This optional feature can alternatively be described, for example, with reference to one or more of the pixels 44 that are most-proximate the seam 50. For example, with the configuration of FIG. 1, the fifth pixel 44e of the first tile 30 is the first tile pixel most-proximate the corresponding first edge 64 (and thus the seam 50). In the pixel array 46 of the resultant tiled display 20, the fifth pixel 44e of the first tile 30 is aligned with a first row R1 and a first column C1. The absence of inter-digitated pixels mentioned above means that the pixels 44 of the second tile 32 are not interposed between the pixels 44 of the first tile 30 along either of the first row R1 or the first column C1. With this optional construction, the substrate edge non-linearity is relatively insubstantial and minimizes the possibility of substrate damage or breakage during handling (e.g., where a substantial non-linearity to be formed by the substrate edge, that non-linear region of the substrate will more easily be damaged or break during handling).

While the tiled display 20 of FIG. 1 has been described as including two of the tiles 30, 32, in other embodiments, three or more of the tiles can be provided. Further, more than one edge of one or more of the tile substrates 40, 42 can incorporate a non-linear shape as described above; the tiles comprising the tiled display may or may not have the same shape or dimension. The pixel pitch in the linear direction toward one tile-to-tile seam may be different from the pixel pitch in an alternate linear direction.

The non-linear edge(s) are one non-limiting example of a complementary shape feature in accordance with principles of the present disclosure. In other embodiments, the tile substrates can be configured and shaped to interface at a linear seam while maintaining a pixel pitch across the seam and providing beneficial tile-to-tile registration. For example, another embodiment tiled display 120 of the present disclosure is shown in simplified form in FIG. 3 and includes a plurality of tiles, such as first, second, third, fourth, fifth, sixth and seventh tiles 130, 132, 134, 136, 138, 140, 142. The tiles 130-142 each include a substrate consistent with the descriptions above, such as substrates 150, 152, 154 identified in FIG. 3 for the first, second and third tiles 130, 132, 134, respectively. The tiles 130-142 can incorporate any of the display technologies previously described, with the corresponding substrate (e.g., the substrates 150-154) carrying a plurality of the pixels or pixel elements 44. As a point of reference, for ease of illustration, pixels are not shown with the sixth and seventh tiles 140, 142; in some embodiments, less than all of the tiles of the tiled displays of the present disclosure include pixels. Regardless, the pixels 44 are collectively arranged in an array 160 upon final assembly of the tiled display 120, with the array 160 comprising a plurality of rows R and columns C each having the same, uniform pixel pitch as described above. Two (or more) neighboring tiles 130-142 have complementary shape features and pixel arrangements that maintain the pixel pitch across a seam formed there between. The uniform pixel pitch of the array 160 can a pixel pitch value in one linear direction that is the same as or different from the pixel pitch value in an alternate linear direction.

For example, the first and second tile substrates 150, 152 have complementary shapes so as to define a first seam 162 there between upon final assembly. In particular, the first and second tile substrates 150, 152 are sized and shaped such that upon final assembly, a first edge 170 of the first tile substrate 150 complements and faces a first edge 180 of the second tile substrate 152 to form the first seam 162. The edges 170, 180 may or may not be in physical contact with one another. The pixels 44 of the first tile 130 are arranged in a matrix at the first tile substrate 150, with the pixel matrix of the first tile 130 having the uniform pixel pitch. The pixels 44 of the second tile 132 are also arranged in a matrix at the second tile substrate 152 with the uniform pixel pitch. A complementary relationship of the pixels 44 of each of the first and second tiles 130, 132 relative to the corresponding substrate first edge 170, 180, respectively, is also provided. With these complementary shapes and pixel arrangements, the pixel pitch between neighboring pixels 44 at opposite sides of the first seam 162 corresponds with the uniform pixel pitch of the tiles 130, 132 (and thus of the pixel array 160 of the tiled display 120). For example, the pixels 44 of the first tile 130 include first and second pixels 44a, 44b proximate the first edge 180. The pixels 44 of the second tile include first and second pixels 44a', 44b'. Upon final assembly, the first pixel 44a of the first tile 130 is registered with the first pixel 44a' (as part of one of the columns C) and with the second pixel 44b' (as part of one of the rows R) of the second tile 132. A center-to-center distance (in the column direction) between the first pixel 44a of the first tile 130 and the first pixel 44a' of the second tile 132 corresponds with the uniform pixel pitch, as does the center-to-center distance (in the row direction) between the first pixel 44a of the first tile 130 and the second pixel 44b' of the second tile 132. Similarly, the center-to-center distance between the second pixel 44b of the first tile 130 and the second pixel 44b' of the second tile 132 (in the column direction) corresponds with the uniform pixel pitch. A similar relationship is established across a second seam 164 defined between an edge of the first tile substrate 150 and an edge of the third tile substrate 154 (i.e., center-to-center distances between neighboring pixels 44 of the first and third tiles 130, 134 across the second seam 164 corresponds with the uniform pixel pitch), as well as at other seams of the tile display 120 (e.g. a third seam 166 defined between an edge of the second tile substrate 152 and an edge of the third tile substrate 154) upon final assembly.

As with previous embodiments, the complementary shapes of at least two of the tile substrates orient at least a segment of the corresponding seam to be oblique to the rows R. For example, an entirety of the first seam 162 and an entirety of the second seam 164 are oblique to the rows R (it being understood that other seams of the tiled display 120 may be perpendicular to or parallel with the rows R; e.g., the third seam 166). Further, upon final assembly, the pixels 44 of neighboring tiles are not inter-digitated (e.g., the pixels 44 of the second, third, and fourth tiles 132, 134, 136 are not interposed between the pixels of the first tile 130 in any of the columns C or rows R). In addition, while several of the seams intersect (e.g., the first, second and third seams 162, 164, 166 intersect one another), none of the intersecting seams of the tiled display 120 establish a continuous linear seam or line parallel with the rows R or with the columns C. This optional arrangement may promote an overall mechanical stability of the tiled display 120 by which the individual tiles 130-136 are less likely to shift relative to one another over time.

Figure 3:
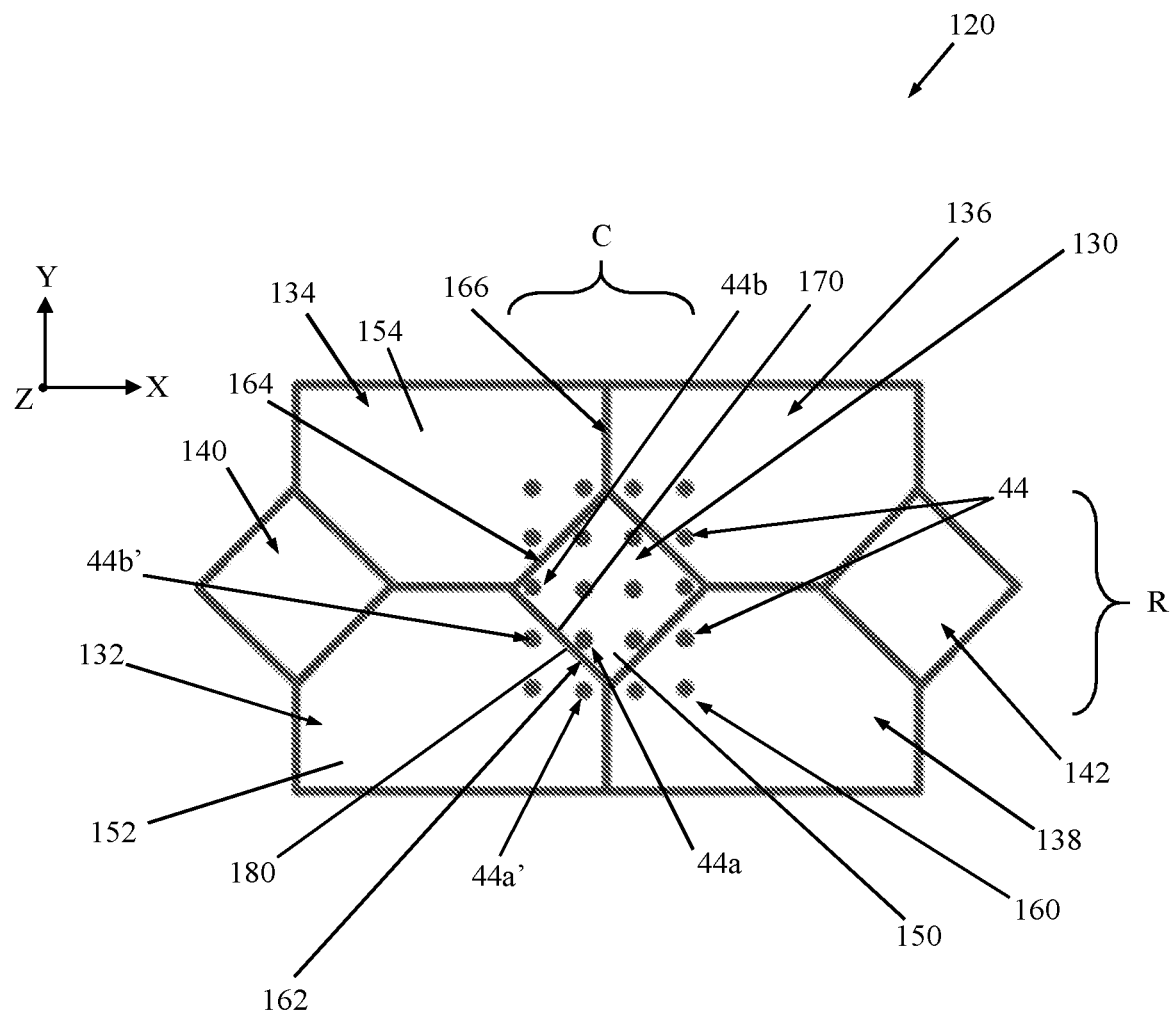
FIG. 3 is a simplified front plan view of another tiled display in accordance with principles of the present disclosure.
Figure 4:
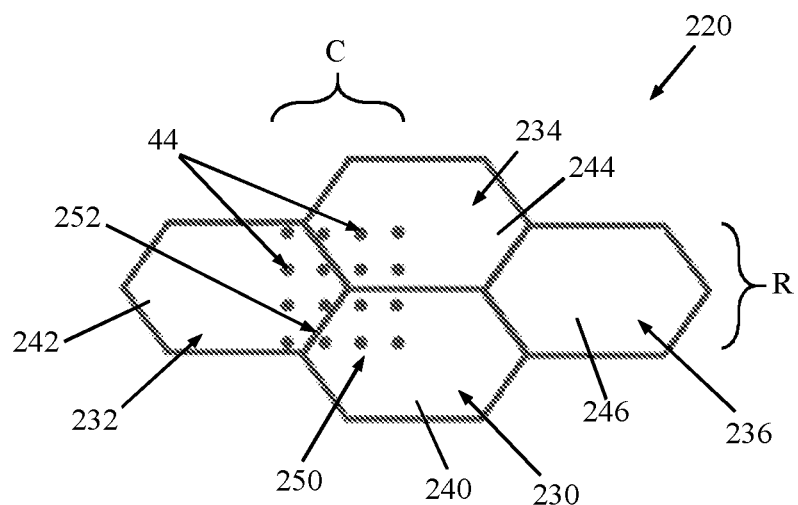
FIG. 4 is a simplified front plan view of another tiled display in accordance with principles of the present disclosure.

The substrate shapes (and corresponding pixel arrangements) of FIG. 3 are non-limiting examples in accordance with principles of the present disclosure. In other embodiments, the tile substrates can have a number of other perimeter shapes, such as rectangular, hexagon, triangle, or any other unit shapes that when assembled relative to one another in forming a tiled display, do not leave voids within the pixel array. All of the individual tiles within the overall assembled tiled display do not need to have the same shape or dimension, but in some embodiments do have similar shapes. With this in mind, another non-limiting embodiment of a tiled display 220 is shown in simplified form in FIG. 4. The tiled display 220 can be akin to the descriptions above, and includes a plurality of tiles, such as first, second, third and fourth tiles 230, 232, 234, 236. The tiles 230-236 each include a substrate consistent with the descriptions above, such as substrates 240, 242, 244, 246, respectively. The tiles 230-236 can incorporate any of the display technologies previously described, with some or all of the corresponding substrates 240-246 carrying a plurality of the pixels or pixel elements 44. For ease of illustration, pixels are not shown with the fourth tile 236. The pixels 44 are collectively arranged in an array 250 upon final assembly of the tiled display 220, with the array 250 comprising a plurality of rows R and columns C each having the same, uniform pixel pitch as described above. The pixel pitch in the rows R may be the same as or different from the pixel pitch in the columns C. Two (or more) neighboring tiles 230-236 have complementary shape features and pixel arrangements that maintain the pixel pitch across a seam formed there between.

For example, the first and second tile substrates 240, 242 have complementary shapes so as to define a first seam 252 there between upon final assembly. The first seam 252 is oblique to the rows R. Further, and commensurate with the descriptions above, the first and second tiles 230, 232 are configured (e.g., substrate shape and pixel arrangement) such that the pixel pitch across the first seam 252 (in the direction of the rows R and in the direction of the columns C) corresponds with the uniform pixel pitch of each individual tile 230, 232 (and thus of the tiled display 220), and the pixels 44 of the first tile 230 and the pixels 44 of the second tile 232 are registered relative to one another (e.g., a registration error of no greater than 50% of the pixel pitch in the designated linear direction, alternatively no greater than 40%, alternatively not greater than 30%, alternatively not greater than 20%, alternatively not greater than 10%, alternatively not greater than 5%, and in some embodiments not greater than 1%). Similar relationships are established at other seams of the tiled display 220. In addition, while several of the seams intersect, none of the intersecting seams of the tiled display 220 establish a continuous linear seam or line parallel with the rows R or with the columns C.

Figure 5:
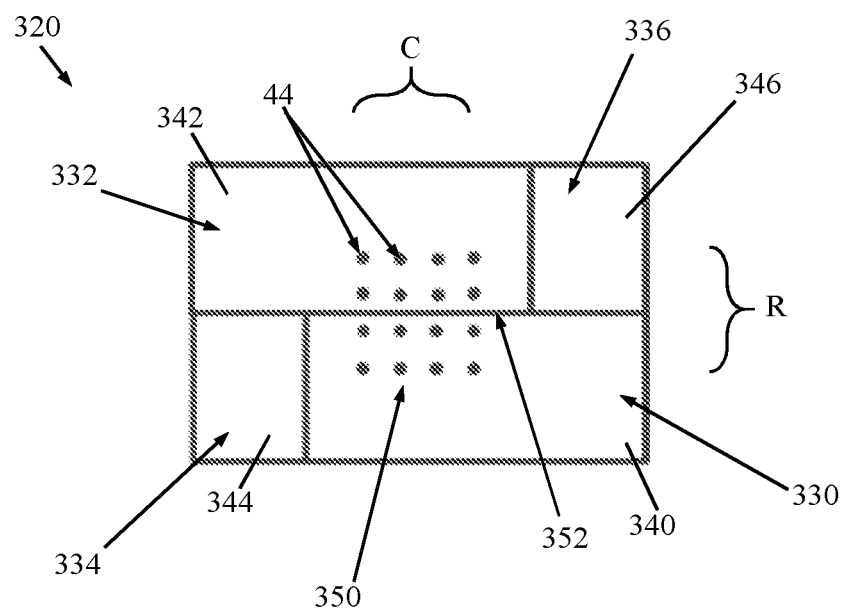
FIG. 5 is a simplified front plan view of another tiled display in accordance with principles of the present disclosure.

Another non-limiting embodiment of a tiled display 320 is shown in simplified form in FIG. 5. The tiled display 320 can be akin to the descriptions above, and includes a plurality of tiles, such as first, second, third, and fourth tiles 330, 332, 334, 336. The tiles 330-336 each include a substrate consistent with the descriptions above, such as substrates 340, 342, 344, 346, respectively. The tiles 330-336 can incorporate any of the display technologies previously described, with some or all of the corresponding substrates 340-346 carrying a plurality of the pixels or pixel elements 44. For ease of illustration, pixels are not shown with the third and fourth tiles 334, 336. The pixels 44 are collectively arranged in an array 350 upon final assembly of the tiled display 320, with the array 350 comprising a plurality of rows R and columns C each having the same, uniform pixel pitch as described above. The pixel pitch in the rows R may be the same as or different from the pixel pitch in the columns C. Two (or more) neighboring tiles 330-336 have complementary shape features and pixel arrangements that maintain the pixel pitch across a seam formed there between.

For example, the first and second tile substrates 340, 342 have complementary shapes so as to define a first seam 352 there between upon final assembly. Commensurate with the descriptions above, the first and second tiles 330, 332 are configured (e.g., substrate shape and pixel arrangement) such that the pixel pitch across the first seam 352 (in the direction of the columns C) corresponds with the uniform pixel pitch of each individual tile 330, 332 (and thus of the tiled display 320), and the pixels 44 of the first tile 330 and the pixels 44 of the second tile 332 are registered relative to one another (e.g., a registration error of no greater than 50% of the uniform pixel pitch). Similar relationships can be established at other seams of the tiled display 220. In addition, while several of the seams intersect, none of the intersecting seams of the tiled display 320 establish a continuous linear seam or line parallel with the columns C.

Any of the shapes described above can be imparted into the corresponding substrate via known fabrication techniques appropriate for the particular substrate material(s). For example, methods to produce the desired substrate shape can include mechanical scribe, laser cutting, etching, thermal forming, etc. Also, multiple processes can be used to generate the described substrate shape. For example, the substrate can initially be mechanically scribed and then etched.

Substrate Edge Profile

In addition, or as an alternative, to the substrate shapes described above, in some embodiments of the present disclosure, the complementary features incorporated into tiles of the tiled display can include a substrate edge profile. With reference to FIG. 2B, "edge profile" is in reference to a shape of one or more of the substrates edges 64, 66, 68 in the Z or depth direction in extension between the opposing major faces 60, 62. Relative to the vantage point of the view of FIG. 2B, the edge profile is most prominently visible for the first and third edges 64, 68, and can be described with respect to a major plane P1 of the first major face 60 and a major plane P2 of the second major face 62 (it being understood that in some embodiments, the major planes P1, P2 are parallel). With the construction of FIG. 2B, a profile of the first edge 64 is such that an entirety of the first edge 64 in the depth direction Z is perpendicular the major plane P1, P2 of the major faces 60, 62. The third edge 68 has a similar edge profile (i.e., entirely perpendicular to the major plane P1, P2 of the major faces 60, 62 in the depth direction Z).

Against the above background, in other embodiments of the present disclosure, at least a section of the profile of at least one of the edges of the tile substrate in the depth direction Z is not perpendicular (i.e., a deviation of at least 2 degrees from a truly perpendicular relationship, alternatively at least 3 degrees, alternatively at least 5 degrees, and in some embodiments at least 10 degrees) to one or both of the major planes P1, P2. For example, portions of another embodiment tiled display 400 in accordance with principles of the present disclosure are shown in simplified form in FIG. 6. The tiled display 400 can be akin to the descriptions above, and includes a plurality of tiles, such as first and second tiles 410, 412. The tiles 410, 412 each include a substrate consistent with the descriptions above, such as substrates 420, 422, respectively. The tiles 410, 412 can incorporate any of the display technologies previously described, with the corresponding substrates 420, 422 carrying a plurality of the pixels or pixel elements 44. The pixels 44 are collectively arranged in an array upon final assembly of the tiled display 400, with the array comprising a plurality of rows and columns each having the uniform pixel pitch as described above. The pixel pitch in the rows may be the same as or different from the pixel pitch in the columns. The neighboring first and second tiles 410, 412 have complementary shape features (e.g., edge profile features) and pixel arrangements that maintain the uniform pixel pitch across a seam 424 formed there between.

The first tile substrate 420 defines opposing, first and second major faces 430, 432 and a first edge 434 extending between the major faces 430, 432 in the Z or depth direction. The opposing major faces 430, 432 each define a major plane P1*a*, P2*a*. An entirety of an edge profile of the first edge 434 is not perpendicular to the major planes P1*a*, P2*a*. For example, an intersection of the first edge 434 and the first major face 430 defines an acute angle, and an intersection of the first edge 434 and the second major face 432 defines an obtuse angle. The second tile substrate 422 also defines opposing, first and second major faces 440, 442 and a first edge 444 extending between the major faces 440, 442 in the Z or depth direction. The opposing major faces 440, 442 each define a major plane P1*b*, P2*b*. An entirety of an edge profile of the first edge 444 is not perpendicular to the major planes P1*b*, P2*b*. Moreover, a spatial orientation of the second tile first edge 444 is complementary with that of the first tile first edge 434. For example, an intersection of the first edge 444 and the first major face 440 defines an obtuse angle, and an intersection of the first edge 444 and the second major face 442 defines an acute angle. In the assembled arrangement of FIG. 6, the first tile first edge 434 faces the second tile first edge 444 to define the seam 424, and the first edges 434, 444 are substantially parallel (i.e., within 5 degrees of a truly parallel relationship). Relative to the orientation of FIG. 6, the first tile first edge 434 can be viewed as overlying the second tile first edge 444.

Figure 6:
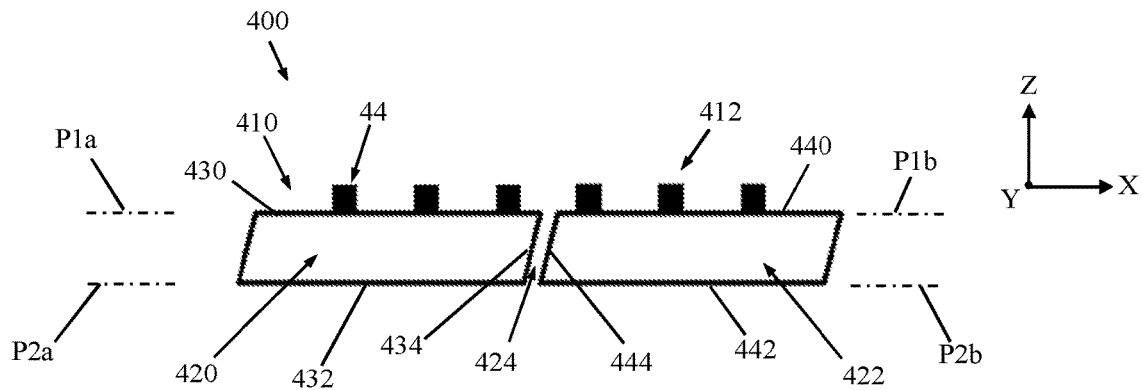
FIG. 6 is a simplified end view of a portion of another tiled display in accordance with principles of the present disclosure.

FIG. 6 further reflects that in some embodiments, upon final assembly of the tiled display 400, neighboring tiles (such as the first and second tiles 410, 412) do not physically contact one another (e.g., the first tile substrate 420 and the second tile substrate 422 are physically separated from one another, such that the seam 424 is a gap or space). As described below, a material can be disposed or filled into the gap. In other embodiments, the tiles 410, 412 are in physical contact upon final assembly. Regardless, the complementary edge profiles enables complementary fitting of the adjacent tiles 410, 412 so that the uniform pixel pitch of the tiled display 400 is maintained across the seam 424. The complementary edge profiles can also enable vertical alignment of the pixels 44 and/or of the substrates of neighboring tiles (e.g., the first tile substrate 420 and the second tile substrate 422).

Figure 7:
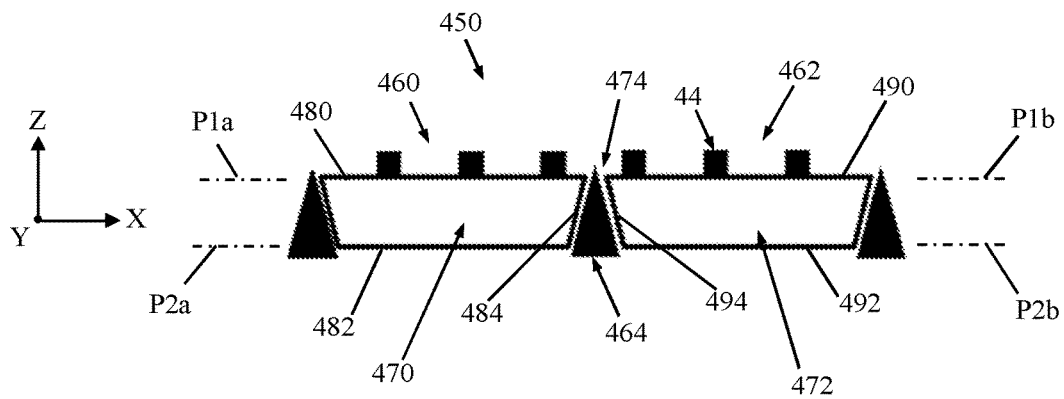
FIG. 7 is a simplified end view of a portion of another tiled display in accordance with principles of the present disclosure.

Portions of another embodiment tiled display 450 in accordance with principles of the present disclosure are shown in simplified form in FIG. 7. The tiled display 450 can be akin to the descriptions above, and includes a plurality of tiles, such as first and second tiles 460, 462 and one or more frame elements, such as frame element 464. The tiles 460, 462 each include a substrate consistent with the descriptions above, such as substrates 470, 472, respectively. The tiles 460, 462 can incorporate any of the display technologies previously described, with the corresponding substrates 470, 472 carrying a plurality of the pixels or pixel elements 44. The pixels 44 are collectively arranged in an array upon final assembly of the tiled display 450, with the array comprising a plurality of rows and columns each having the uniform pixel pitch as described above. The pixel pitch in the rows may be the same as or different from the pixel pitch in the columns. The neighboring first and second tiles 460, 462 have complementary shape features and pixel arrangements that, in combination with the frame element(s) 464, maintain the uniform pixel pitch across a seam 474 (referenced generally) formed there between.

The first tile substrate 470 defines opposing, first and second major faces 480, 482 and a first edge 484 extending between the major faces 480, 482 in the Z or depth direction. The opposing major faces 480, 482 each define a major plane P1*a*, P2*a*. An entirety of an edge profile of the first edge 484 is not perpendicular to the major planes P1*a*, P2*a*. For example, an intersection of the first edge 484 and the first major face 480 defines an acute angle, and an intersection of the first edge 484 and the second major face 482 defines an obtuse angle. The second tile substrate 472 also defines opposing, first and second major faces 490, 492 and a first edge 494 extending between the major faces 490, 492 in the Z or depth direction. The opposing major faces 490, 492 each define a major plane P1*b*, P2*b*. An entirety of an edge profile of the first edge 494 is not perpendicular to the major planes P1*b*, P2*b*. For example, an intersection of the first edge 494 and the first major face 490 defines an acute angle, and an intersection of the first edge 494 and the second major face 492 defines an acute angle.

The frame element 464 is sized and shaped in accordance with the complementary profiles of the first edges 484, 494. In the assembled arrangement of FIG. 7, the first tile first edge 484 faces the second tile first edge 494 to define the seam 474. The frame element 464 is located in or along the seam 474, and maintains the first and second tiles 460, 462 relative to one another (e.g., the first and second tile substrates 470, 472 can be affixed to the frame element 464). The complementary edge profiles, arrangement of the pixels 44 of each of the tiles 460, 462 relative to the corresponding first edge 484, 494, and spatial arrangement of the edges 484, 494 relative to one another as dictated by the frame element 464 combine to maintain the uniform pixel pitch across the seam 474 (i.e., the center-to-center distance between neighboring pixels 44 at opposite sides of the seam 474 in the designated linear direction corresponds with the uniform pixel pitch established at each of the tiles 460, 462, and thus of the tiled display 450, in the designated linear direction).

As mentioned above, the tiled displays of the present disclosure can incorporate the optional complementary substrate edge profiles with neighboring tiles spaced from one another (e.g., with the non-limiting embodiments of FIGS. 6 and 7). In other embodiments, the tiles with complementary profiled edges can be in contact with one another upon final assembly along the extended length of interface or in discrete locations. For example, portions of another embodiment tiled display 500 in accordance with principles of the present disclosure are shown in simplified form in FIG. 8. The tiled display 500 can be akin to the descriptions above, and includes a plurality of tiles, such as first and second tiles 510, 512. The tiles 510, 512 each include a substrate consistent with the descriptions above, such as substrates 520, 522, respectively. The tiles 510, 512 can incorporate any of the display technologies previously described, with the corresponding substrates 520, 522 carrying a plurality of the pixels or pixel elements 44. The pixels 44 are collectively arranged in an array upon final assembly of the tiled display 500, with the array comprising a plurality of rows and columns each having the uniform pixel pitch as described above. The pixel pitch in the rows may be the same as or different from the pixel pitch in the columns. The neighboring first and second tiles 510, 512 have complementary shape features and pixel arrangements that maintain the uniform pixel pitch across a seam 524 formed there between.

The first tile substrate 520 defines opposing, first and second major faces 530, 532 and a first edge 534 extending between the major faces 530, 532 in the Z or depth direction. The opposing major faces 530, 532 each define a major plane P1a, P2a. At least a section of an edge profile of the first edge 534 is not perpendicular to the major planes P1a, P2a. For example, the first edge 534 can have a rounded or "bullet" shaped profile as shown. The second tile substrate 522 also defines opposing, first and second major faces 540, 542 and a first edge 544 extending between the major faces 540, 542 in the Z or depth direction. The opposing major faces 540, 542 each define a major plane P1b, P2b. With the embodiment of FIG. 8, an edge profile of the second tile first edge 544 is perpendicular to the major planes P1b, P2b (it being understood that an opposing, second edge 546 of the second tile substrate 522 can have the rounded profile as described above).

Figure 8:
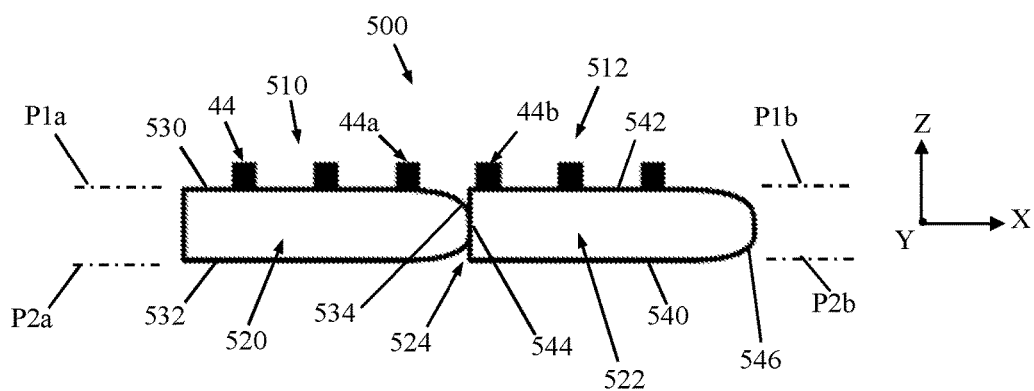
FIG. 8 is a simplified end view of a portion of another tiled display in accordance with principles of the present disclosure.

In the assembled arrangement of FIG. 8, the first tile first edge 534 faces the second tile first edge 544 to define the seam 524. In some embodiments, the tiles 510, 512 are configured such that the first tile first edge 534 abuts or is in contact with the second tile first edge 544. The complementary edge profiles enables complementary fitting of the adjacent tiles 510, 512 This complementary fitting along with an arrangement of the pixels 44 relative to the corresponding substrate first edge 534, 544 combine to maintain the uniform pixel pitch across the seam 524 either continuously along the length of interface or in discrete locations. In this regard, FIG. 8 identifies a first pixel 44a of the first tile 510 that is otherwise most-proximate the corresponding first edge 534, and a second pixel 44b of the second tile 512 that is otherwise most-proximate the corresponding first edge 544 and that is registered or aligned with the first pixel 44a upon final assembly of the tiled display 500 (i.e., the first and second pixels 44a, 44b are neighboring pixels at opposite sides of the seam 524). Due to the rounded profile of the first tile first edge 534, it may not be possible to locate to locate the first pixel 44a in highly close proximity to a terminal face of the first tile first edge 534 (and thus to the resultant seam 524). Conversely, the edge profile of the second tile first edge 544 permits the second pixel 44b to be located in highly close proximity to the seam 524. With this optional construction, a distance between the first pixel 44a and the seam 524 differs from a distance between the second pixel 44b and the seam 524, and the first and second tiles 510, 512 are configured such that the center-to-center distance between the neighboring pixels 44a, 44b in the designated linear direction at opposite sides of the seam 524 corresponds with the uniform pixel pitch established at each of the tiles 510, 512 and thus of the tiled display 500 in the designated linear direction.

Figure 9:
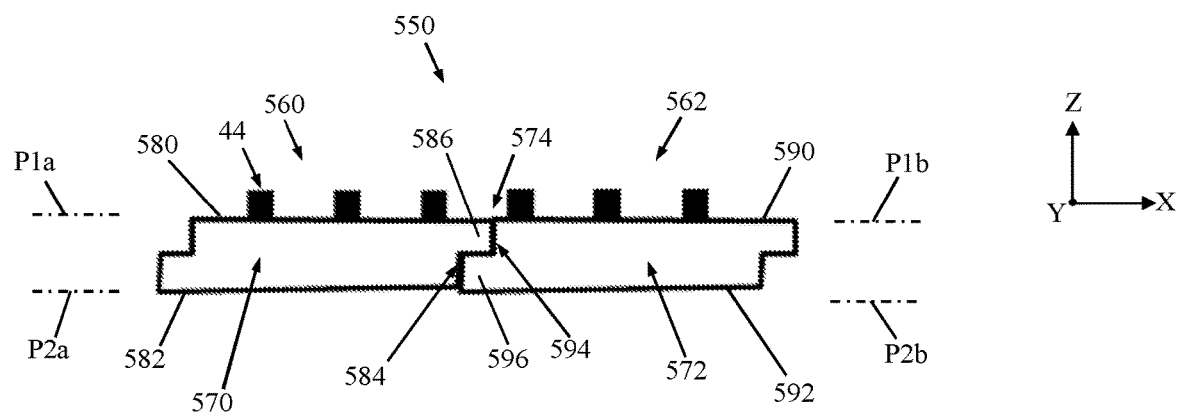
FIG. 9 is a simplified end view of a portion of another tiled display in accordance with principles of the present disclosure.

Portions of another embodiment tiled display 550 in accordance with principles of the present disclosure are shown in simplified form in FIG. 9. The tiled display 550 can be akin to the descriptions above, and includes a plurality of tiles, such as first and second tiles 560, 562. The tiles 560, 562 each include a substrate consistent with the descriptions above, such as substrates 570, 572, respectively. The tiles 560, 562 can incorporate any of the display technologies previously described, with the corresponding substrates 570, 572 carrying a plurality of the pixels or pixel elements 44. The pixels 44 are collectively arranged in an array upon final assembly of the tiled display 550, with the array comprising a plurality of rows and columns each having the uniform pixel pitch as described above. The pixel pitch in the rows may be the same as or different from the pixel pitch in the columns. The neighboring first and second tiles 560, 562 have complementary shape features and pixel arrangements that maintain the uniform pixel pitch across a seam 574 formed there between in the designated linear direction.

The first tile substrate 570 defines opposing, first and second major faces 580, 582 and a first edge 584 extending between the major faces 580, 582 in the Z or depth direction. The opposing major faces 580, 582 each define a major plane P1a, P2a. At least a section of an edge profile of the first edge 584 is not perpendicular to the major planes P1a, P2a. For example, the first edge 584 can have a stepped-shaped profile, forming a protruding head 586 (e.g., the head 586 represents a continuation of the first major face 580, and a thickness or Z direction dimension of the head 586 is less than the thickness of the substrate between the major faces 580, 582). The second tile substrate 572 also defines opposing, first and second major faces 590, 592 and a first edge 594 extending between the major faces 590, 592 in the Z or depth direction. The opposing major faces 590, 592 each define a major plane P1b, P2b. At least a section of an edge profile of the first edge 594 is not perpendicular to the major planes P1b, P2b. In particular, the second tile first edge 594 can have a stepped-shaped profile that is complementary to that of the first tile first edge 584, forming a protruding floor 596.

Upon final assembly of the tiled display 550, the first tile first edge 584 faces the second tile first edge 594 to define the seam 574, and the head 586 and the floor 596 are sized and shaped such that the head 586 overlies and contacts the floor 596. The complementary edge profiles enables complementary fitting of the adjacent tiles 560, 562 and vertical alignment of the pixels 44. In addition, this complementary fitting along with an arrangement of the pixels 44 relative to the corresponding substrate first edge 584, 594 combine to maintain the uniform pixel pitch across the seam 574 in the designated linear direction commensurate with the descriptions above.

Figure 10:
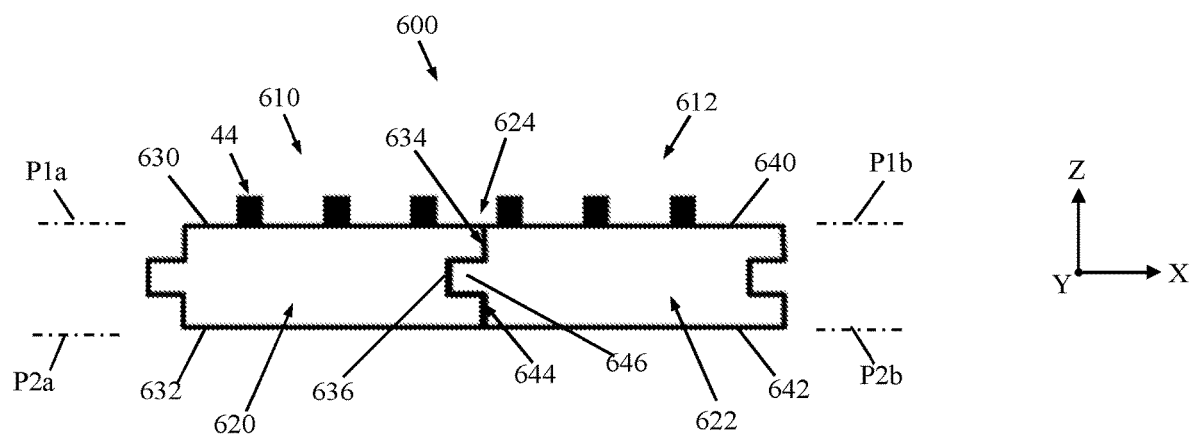
FIG. 10 is a simplified end view of a portion of another tiled display in accordance with principles of the present disclosure.

Portions of another embodiment tiled display 600 in accordance with principles of the present disclosure are shown in simplified form in FIG. 10. The tiled display 600 can be akin to the descriptions above, and includes a plurality of tiles, such as first and second tiles 610, 612. The tiles 610, 612 each include a substrate consistent with the descriptions above, such as substrates 620, 622, respectively. The tiles 610, 612 can incorporate any of the display technologies previously described, with the corresponding substrates 620, 622 carrying a plurality of the pixels or pixel elements 44. The pixels 44 are collectively arranged in an array upon final assembly of the tiled display 600, with the array comprising a plurality of rows and columns each having the uniform pixel pitch as described above. The pixel pitch in the rows may be the same as or different from the pixel pitch in the columns. The neighboring first and second tiles 610, 612 have complementary shape features and pixel arrangements that maintain the uniform pixel pitch across a seam 624 formed there between in the designated linear direction.

The first tile substrate 620 defines opposing, first and second major faces 630, 632 and a first edge 644 extending between the major faces 630, 632 in the Z or depth direction. The opposing major faces 630, 632 each define a major plane P1$a$, P2$a$. At least a section of an edge profile of the first edge 634 is not perpendicular to the major planes P1$a$, P2$a$. For example, a profile of the first edge 634 can form a slot 636. The second tile substrate 622 also defines opposing, first and second major faces 640, 642 and a first edge 644 extending between the major faces 640, 642 in the Z or depth direction. The opposing major faces 640, 642 each define a major plane P1$b$, P2$b$. At least a section of an edge profile of the first edge 644 is not perpendicular to the major planes P1$b$, P2$b$. In particular, a profile of the second tile first edge 644 can form a rib 646. The slot 636 and the rib 646 can have a complementary configuration.

Upon final assembly of the tiled display 600, the first tile first edge 634 faces the second tile first edge 644 to define the seam 624, and the rib 646 nests within the slot 636. The complementary edge profiles enables complementary fitting of the adjacent tiles 610, 612 and vertical alignment of the pixels 44. The edges 634, 644 may or may not be in physical contact with one another. In addition, this complementary fitting along with an arrangement of the pixels 44 relative to the corresponding substrate first edge 634, 644 combine to maintain the uniform pixel pitch across the seam 624 in the designated linear direction commensurate with the descriptions above.

The complementary substrate edge profiles described above with respect to FIGS. 6-10 are a few, non-limiting examples of the optional edge profiles envisioned by the present disclosure. The substrate edge profiles can be square, rounded, angled, or have a non-linear profile. Further, all edges of a particular substrate may or may not have the same profile. In some embodiments, one or more of the edge profiles can have additional coatings to manage physical contact and/or optical effects. The edge profile(s) can be imparted into a particular substrate in a variety of manners. For example, some methods to produce the edge profiles of the present disclosure include mechanical scribe, laser cutting, etching, thermal forming, grinding, etc. Also, multiple processes can be used to create a desired edge profile. For example, the substrate can initially be mechanically scribed, followed by etching. As indicated above, the pixels (e.g., emitting element) carried by the substrates of neighboring tiles of the tiled display can be located at different distances from the corresponding substrate edges along the perimeter. In some embodiments, for example, this configuration may be beneficial depending on the edge profile forming process(es) employed. For example, a single tile substrate with two mechanically scribed edges and two ground edges may have the pixels (e.g., Micro-LEDs) located at different distances from the actual substrate etch. When neighboring tiles are assembled, though, the tile-to-tile pixel pitch is maintained.

Substrate Cutting/Formation Processes

As indicated above, the optional substrate shapes and/or substrate edge profiles can be imparted into a particular substrate using various techniques. In some embodiments, one or both features can be generated via non-diffracting beam cutting. Using non-diffracting beam cutting technology, glass substrates useful with the tiles of the present disclosure can be laser-cut, or laser cut and chemically etched, to form the precise tile shape and/or profile and dimensions described above. Non-diffracting beam cutting is described, for example, in US Application Publication No. 2014/0199519 entitled "Method and Device for the Laser-Based Machining of Sheet-Like Substrates", the entire teachings of which are incorporated herein by reference. With these and other processes, it is possible to cut tile substrates with dimension accuracies of less than 20 µm across large substrate sheets (dimension greater than 500 mm), or less than 10 µm across smaller sheets (dimension on the order of 100 mm). Such accuracy can be important in order to keep the position error between neighboring tiles to less than 50% the pixel pitch, which can be on the order of 200 µm or less. Using this optional laser process with glass substrates, the glass cut edges can typically have thin vertical striations extending the full thickness of the substrate, with a pitch between the striations in the range of 2-25 µm. These same laser cutting processes, or laser cutting plus acid etch process, can further be used to make more complex edge profile features, such as those depicted in FIGS. 9 and 10 and the like.

In yet other embodiments, a related process of laser perforation and chemical etching can be used to create optional, desired features into or on a tile substrate of the present disclosure. For example, and as mentioned above, with some display technologies, it may be desirable for one or more holes to be formed through a thickness of the tile substrate (e.g., through-glass vias that allow for metallization and electrical signal conduction through the substrate). Alternatively or in addition, it may be desirable to impart alignment holes for part translational placement or rotational orientation. In the case of etched parts, the signatures of the laser formation process may still be evident, but they are altered by the etching process as will be apparent to one of ordinary skill.

Methods of Assembly

Various methods can be employed for assembling the tiled display from a plurality of tiles. In some embodiments of the present disclosure, for example as represented by FIG. 6, the tiles can be assembled in a way that creates a physical separation between the neighboring tiles. A polymeric or other physical spacer can optionally be disposed within this physical separation. The material within the gap between the tile substrates can also serve an optical function to minimize light that would make the corresponding seam optically visible. Optical effects can include an index matched material or a black matrix material. A soft material such as a polymer in the gap between the tile substrates can also be configured to serve as a cushion, preventing chipping or other reliability-impairing defects when the tiles are placed in contact with one another. Such material around the edges of the tiles can be pre-applied to the individual tiles, or can be applied post-assembly into a multi-tile display. The material between the tile substrates can also be or include an adhesive.

Figure 11:
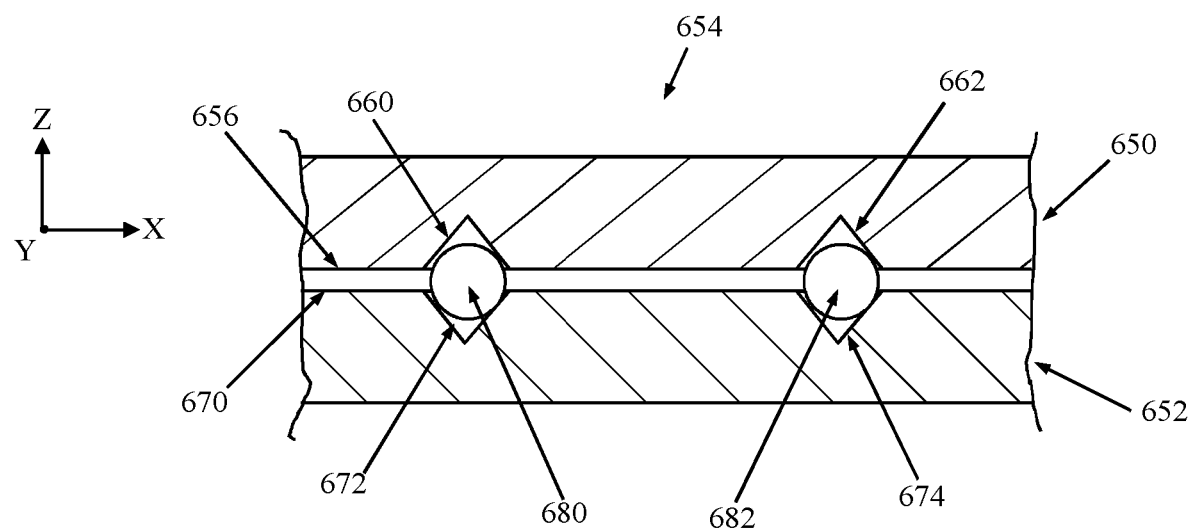
FIG. 11 is a simplified cross-sectional view of a portion of a tile mounted to a reference sheet in the assembly of a tiled display in accordance with principles of the present disclosure.

Regardless of whether the tiles are physically spaced from one another, some methods of the present disclosure include arranging the tiles so that there are overlapping circuit board or mechanical mounting on a backside of the tiled display. These overlapping circuit boards or mechanical mountings on the backside do not need to extend completely under all assembled tiles making up the tiled display, but should extend over portions of at least two neighboring tiles. Moreover, mechanical alignment of the tiles can be achieved in various manners, such as by alignment pins and through holes. In related embodiments, a kinematic mounting or coupling can be provided. For example, FIG. 11 illustrates, in simplified form, kinematic mounting of a substrate 650 to a reference sheet 652 as part of the assembly of a tiled display in accordance with some methods of the present disclosure. The substrate 650 is provided as part of a tile 654 that can have any of the constructions described above (e.g., the substrate 650 carries a plurality of pixels (not shown)). The substrate 650 can generally assume any of the formats previously described; with the embodiment of FIG. 11, one or more alignment features are formed in a major face 656 of the substrate 650, such as first and second alignment grooves 660, 662. The reference sheet 652 can be sized and shaped in accordance with expected dimensions of the resultant tiled display (i.e., the plurality of tiles to be assembled in generating the tiled display are all placed over the reference sheet 652). The reference sheet 652 may extend across the entire assembled tiled display, or may not extend completely under all assembled tiles making up the tiled display (but at least extends over portions of at least two neighboring tiles). With some methods of the present disclosure, the reference sheet 652 defines a reference surface 670 that includes or provides one or more reference features, such as first and second reference grooves 672, 674, corresponding with the alignment features of the substrate 650. The alignment grooves 660, 662 and the reference grooves 672, 674 can be of substantially similar shape and size, each generally configured to receive a portion of a pin 680, 682, respectively, for reasons made clear below.

With the configuration of FIG. 11, fabrication of a tiled display can include assembling multiple ones of the tiles 654 to the reference sheet 652, with an arrangement of each of the tiles 654 relative to the reference sheet 652 (and relative to one another) being dictated by an interface with the pins 680, 682. For example, prior to placement of each tile 654 over the reference sheet 652, a pin is loaded into the reference grooves (e.g., the pins 680, 682 are loaded into the reference grooves 672, 674, respectively). The tile 654 is then spatially arranged and placed over the reference sheet 652 such that the pins 680, 682 are received within the alignment grooves 660, 662, respectively. This same process is repeated for the remaining tiles to complete the tiled display. With this in mind, the reference/alignment features and pins can be configured to provide for one or both of alignment or registration of the tiles relative to one another in the depth (Z) direction and in the display plane (X-Y plane of FIG. 1). Alignment in the depth direction can be facilitated by correlating a shape of each of the alignment grooves 660, 662 and of each of the reference grooves 672, 674 with a diameter of each of the pins 680, 682. The reference grooves 672, 674 are precisely formed in the reference sheet 652, with the corresponding pin 680, 682 thus projecting a predetermined distance beyond the reference surface 670. The alignment grooves 660, 662 are precisely formed in the substrate 650 such that when aligned with and place onto corresponding ones of the pins 680, 682, the substrate 650 will be supported and maintained at a predetermined distance (in the depth or Z direction) above the reference sheet 652. Remaining ones of the tile are similarly supported and maintained at this same, predetermined distance from the reference sheet 652. Thus, the tiles of the tiled display are collectively aligned in the depth direction.

Figure 12A:
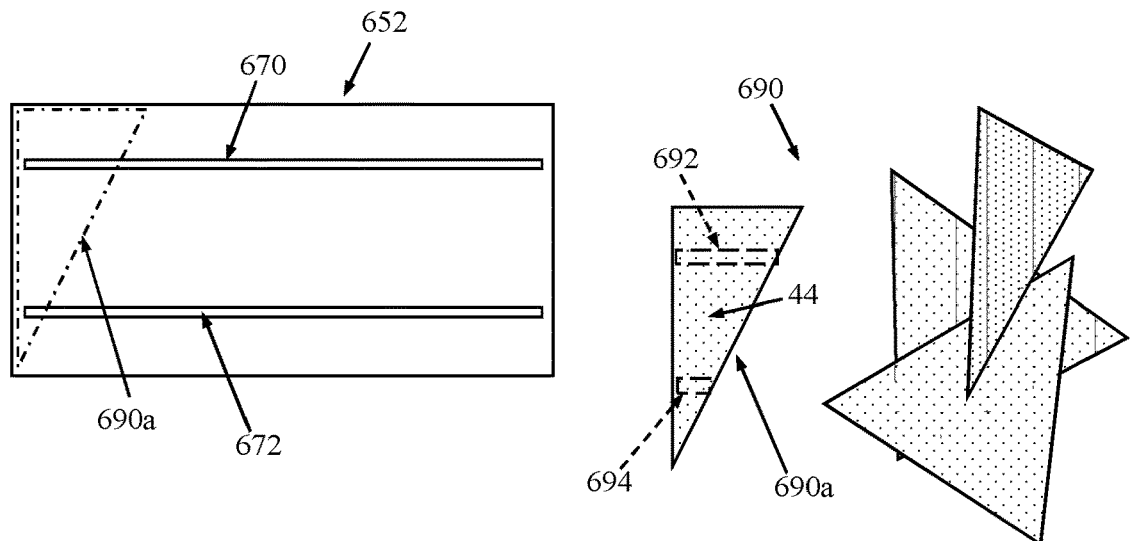
FIGS. 12A-12C illustrate method of assembling a tiled display using the reference sheet of FIG. 11.

Alignment or registration of the tiles of the tiled display in the display plane (X-Y plane of FIG. 1) can be facilitated by forming the alignment grooves 660, 662 in each of tile substrates 650 at predetermined spatial locations (in the X-Y plane) relative to an expected arrangement of the pixel matrix carried by the substrate relative to the perimeter shape. The references grooves (e.g., the reference grooves 672, 674) are formed in the reference sheet 652 at predetermined spatial locations that correspond with perimeter shapes of each of the tiles that will collectively form the tiled display, and desired tile-to-tile registration. In this regard, neighboring tiles of a tiled display will each have an expected perimeter shape and an expected pixel matrix arrangement relative to this perimeter shape. Based on this understanding, the reference grooves are arranged in a pattern that provides for every tile of the to-be-formed tiles display, and the alignment grooves of each tiles are formed at locations along the corresponding tile in accordance with the pattern. By way of non-limiting example, FIG. 12A is a simplified representation of the reference sheet 652, including the first and second reference grooves 672, 674 (it being understood that any other number of reference grooves, either greater or lesser, is equally acceptable). A pin (not shown) is located with each of the reference grooves 672, 674 as described above. A plurality of tiles 690 (referenced generally) are also provided for assembly over the reference sheet 652. The substrate of each of the tiles 690 forms alignment grooves arranged to locate the corresponding pixel matrix at a predetermined location when aligned to or mated with corresponding ones of the reference grooves 672, 674 of the reference sheet 652. For example, first and second alignment grooves 692, 694 are illustrated for the first tile 690*a*. The alignment grooves 692, 694 are located and arranged so as to correspond with respective ones the reference grooves 672, 674 such that when placed over the reference sheet 652, the first tile 690*a* will be arranged at a known orientation relative to the reference sheet 652 (i.e., the known orientation of the first tile 690*a* relative to the reference sheet 652, as dictated by alignment of the alignment grooves 692, 694 with the reference grooves 672, 674, is shown in phantom in FIG. 12A). Based upon this known orientation, the pixels 44 (referenced generally) of the first tile 690*a* are arranged and located relative to the alignment grooves 692, 694 (or vice-versa) and the perimeter shape of the first tile 690*a* (or vice-versa) such that the pixels 44 will be spatially arranged in a pre-determined, desired fashion relative to the reference sheet 652 upon assembly of the first tile 690*a* over the reference sheet 652.

Figure 12B:
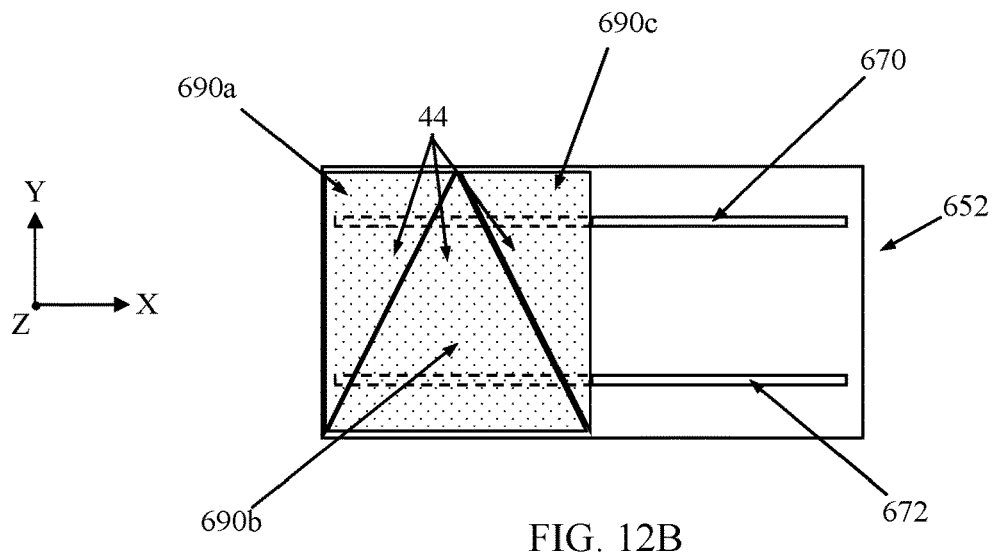

FIG. 12B illustrates a partially assembled state in which the first tile 690*a*, as well as second and third tiles 690*b*, 690*c*, have been assembled over the reference sheet 652. Commensurate with the descriptions above, the alignment grooves (hidden) of the substrate of each of the tiles 690*a*-690*c* mate or align with corresponding ones of the reference grooves 672, 674. As a result of this coordinated arrangement, the pixels 44 (referenced generally) and edges of the first-third tiles 690*a*-690*c* are registered and aligned in the display (X-Y) plane. The remaining tiles 690*d*-690*f* are similarly assembled over the reference sheet 652, resulting in a completed tiled display 696 as shown in FIG. 12C.

Figure 12C:
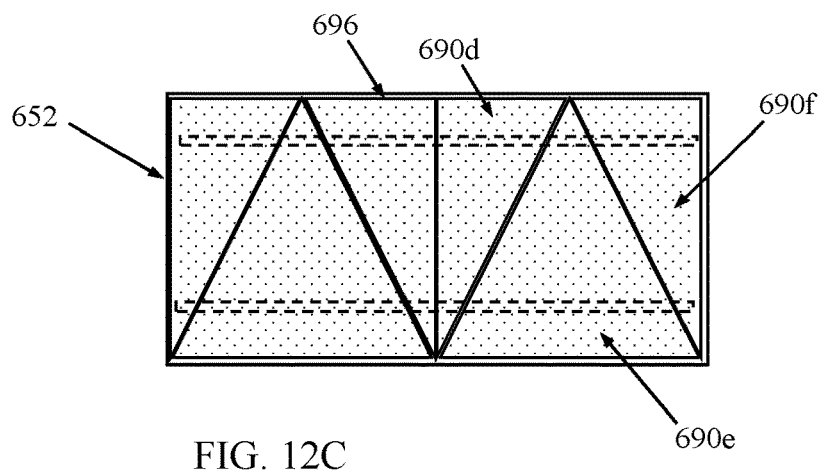

With the assembly methods implicated by FIGS. 11-12C, the reference sheet 652 can be configured for temporary use; once assembled over the reference sheet 652, the tiles can be adhered or otherwise fixed to one another and then be removed from the reference sheet 652. With these and similar techniques, the reference sheet 652 can assume a variety of forms and can be formed of various materials without concern for tiled display operation. In other embodiments, the reference sheet 652 can be configured to serve as a permanent part of the final tiled display, and thus can have appropriate mechanical, electrical and/or optical properties (e.g., the reference sheet 652 can serve as a cover sheet or plate of the tiled display and can be a strengthened glass). With some embodiments in which the tiled display is a backlight, the reference sheet 652 can be the associated liquid crystal cell that extends over portions of at least two neighboring backlight tiles. The reference sheet 652 may be a monolithic sheet that extends across the entire tiled display. Alternatively, there may be multiple reference sheets 652 that are used for assembling the display tiles. In related embodiments, the reference sheets 652 themselves may be tiled.

Figure 13:
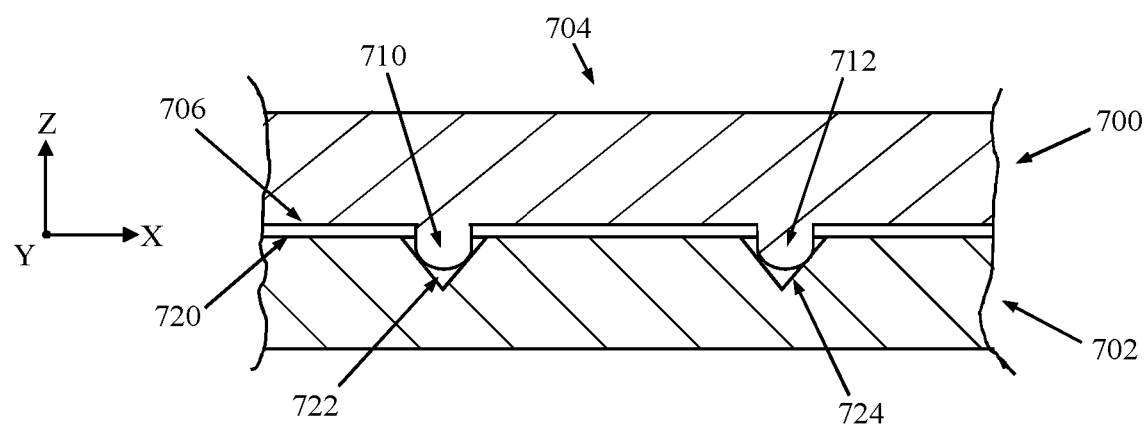
FIG. 13 is a simplified cross-sectional view of a portion of a tile mounted to a reference sheet in the assembly of a tiled display in accordance with methods of the present disclosure.

The optional kinematic mounting techniques and methods of the present disclosure can assume other forms. For example, FIG. 13 illustrates, in simplified form, kinematic mounting of a substrate 700 to a reference sheet 702 in forming a tiled display in accordance with some methods of the present disclosure. The substrate 700 is provided as part of a tile 704 that can have any of the constructions described above (e.g., the substrate 700 carries a plurality of pixels (not shown)). The substrate 700 can generally assume any of the formats previously described; with the embodiment of FIG. 13, one or more alignment features are formed in a major face 706 of the substrate 700, such as first and second bumps 710, 712 (any other number of bumps, either greater or lesser, is equally acceptable). The reference sheet 702 can be sized and shaped in accordance with expected dimensions of the resultant tiled display (i.e., the plurality of tiles to be assembled in generating the tiled display are all placed over the reference sheet 702). With some methods of the present disclosure, the reference sheet 702 defines a reference surface 720 that includes or provides one or more reference features, such as first and second grooves 722, 724, corresponding with the alignment features of the substrate 700. The bumps 710, 712 are configured to be received in and supported at a corresponding one of the grooves 722, 724. In some embodiments, the reference surface 720 can further include a raised ridge or similar structure circumscribing each of the grooves 722, 724 that serves to guide the bump 710, 712 into complete engagement with the corresponding groove 722, 724. Similar to the descriptions above with respect to FIGS. 11-12C, two or more tiles (such as the tile 704) are assembled over the reference sheet 702 at predetermined locations dictated by a pattern of the grooves (such as the grooves 722, 724) and an interface between the bumps (such as the bumps 710, 712) and the grooves, resulting in one or both of tile-to-tile alignment or registration in the depth (Z) direction and the display plane (X-Y plane of FIG. 1).

Figure 14:
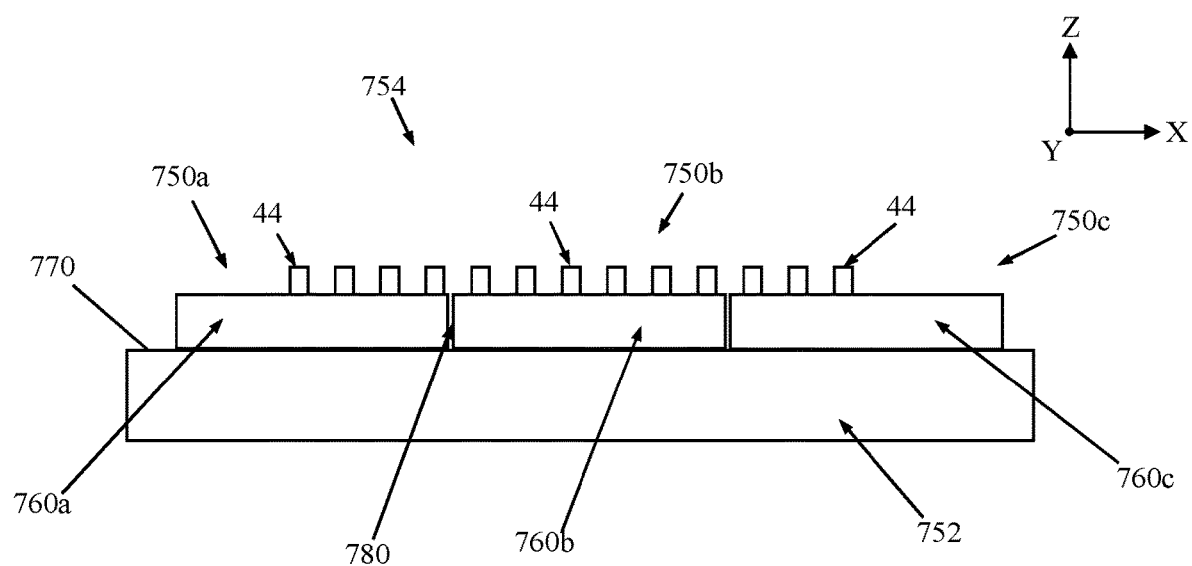
FIG. 14 is a simplified end view of tiles supported by a reference sheet in forming a tiled display in accordance with principles of the present disclosure.

With the embodiments of FIGS. 11-13, tile-to-tile registration can be achieved without relying upon direct, aligning contact between edges of neighboring tiles. Along these same lines, other tiled display assembly methods in accordance with principles of the present disclosure are reflected by the simplified illustration of FIG. 14 in which a plurality of tiles, such as tiles 750a, 750b, 750c, are mounted to a reference sheet 752 in forming a tiled display 754. Each of the tiles 750a, 750b, 750c can assume any of the forms described above (e.g., can incorporate any of the previously-mentioned display technologies) and can be uniform rectangular tiles with substantially straight edges and substantially rectangular profiles or any other shape. Further, each of the tiles 750a, 750b, 750c includes a substrate 760a, 760b, 760c, respectively, carrying a plurality of the pixels 44. The substrates 760a-760c can also have any of the constructions described above, and in some embodiments are configured to have dimensional stability properties, such as glass, glass ceramic, or ceramic. Each of the tiles 750a-750c further includes one or more alignment features. As described in greater detail below, the alignment feature(s) are provided apart from any perimeter edge of the corresponding tile 750a-750c (i.e., the tile alignment feature(s) associated with the embodiments of FIG. 14 are not an edge of the corresponding substrate 760a-760c or any other perimeter edge of the corresponding tile 750a-750c). The reference sheet 752 can be sized and shaped in accordance with expected dimensions of the resultant tiled display 754, and provides a reference surface 770. The reference surface 770 may extend across all assembled tiles or may cover at least portions of at least two neighboring tiles. The reference surface 770 itself may be tiled. In general terms, fabrication of the tiled display 754 includes individually placing each of the tiles 750a-750c onto the reference surface 770, manipulating the tiles 750a-750c along the reference surface 770 to generally arrange the tiles 750a-750c proximate one another in a neighboring tile fashion, and registering the pixels 44 of neighboring tiles by aligning the corresponding alignment features. The assembly methods of FIG. 14 effectuate registration or alignment of the pixels 44 between neighboring tiles (e.g., the neighboring first and second tiles 750a, 750b, and the neighboring second and third tiles 750b, 750c) directly in the display plane (X-Y plane of FIG. 1); edge-to-edge contact between neighboring tiles is not relied upon for assembly and pixel registration. Registration based on edges of the tiles 750a-750c is not required. Instead, pixel registration is based on features that have been placed/created on each of the substrates 760a-760c with precision, and does not rely on edge position or shape variation. Thus, any inevitable, statistical variations in straightness or roughness of the tile edges do not affect desired pixel registration.

The alignment feature(s) provided with each of the tiles 750a-750c can assume various forms. For example, one (or more) of the pixels 44 provided with each of the tiles 750a-750c can serve as the alignment feature. In this regard, where the tiles 750a-750c incorporate micro-LED or LED display technology (e.g., each of the pixels 44 in FIG. 14 comprise one or more micro-LEDs or LEDs), the single or multiple micro-LEDs (or LEDs) designated as the alignment feature of a particular tile can be illuminated (electrically or optically excited) during the assembly process. With these and related embodiments, the step of registering the pixels 44 of the neighboring, first and second tiles 750a, 750b can include illuminating a selected one (or more) of the micro-LED pixels 44 of each of the tiles 750a, 750b and then optically aligning the illuminated micro-LED pixels 44. The alignment feature(s) provided with each of the tiles 750a-750c can assume other forms, such as structures within the TFT (where provided) or electronic interconnect patterning, patterned registration marks, etc. The alignment feature(s) may be created for use in combination with a vision system and active alignment methods as described below. Alternatively, the alignment feature(s) may be physical kinematic structures as described above that enable passible alignment of the tiles. Regardless, and as mentioned above, the alignment feature(s) associated with the embodiments of FIG. 14 is/are something other than a perimeter edge of the corresponding tile 750a-750c.

Apart from the alignment feature(s), the tiles implicated by the embodiment of FIG. 14 (e.g., the tiles 750a-750c) can have any of the constructions described above. The tiles can be rectangular, hexagon, triangle, or any other unit shapes that when assembled relative to one another do not leave voids within the resultant pixel array. All of the individual tiles within the overall assembled tiled display may or may not have the same shape or dimensions. In some embodiments, the individual tiles are purposefully undersized relative to desired outer dimensions of the resultant tiled display 754. For example, each of the tiles 750a-750c, and in particular each of the corresponding substrates 760a-760c, is designed to have, in theory, an identical length (X direction). The combined substrate lengths (X direction) is designed to be less than the desired length (X direction) of the resultant the tiled display 754. In other words, the tiles 750a-750c are designed such that neighboring tiles will be slightly spaced from one another upon final assembly (e.g., in the view of FIG. 14, the facing edges of the first and second tiles 750a, 750b are spaced from one another at a seam 780). With this optional approach, desired pixel registration across neighboring tiles (e.g., across the seam 780) is not negatively affected by inevitable variations in otherwise expected straightness and/or roughness properties of the tile edges (e.g., edges of the substrates 760a-760c). In other embodiments, neighboring tiles can be in contact with one another.

The reference sheet 752 can assume various forms appropriate for promoting the assembly methods described herein (e.g., manipulating (for example sliding) the tiles 750a-750c along the reference surface 770). For example, the reference sheet 752 can be a continuous body (e.g., sheet of glass) or can be a non-continuous frame structure. The reference sheet 752 can have the same thickness as, can be thinner than, or can be thicker than, the thickness (depth direction) of the substrates 760a-760c. In some embodiments, to assist in moving (or not moving) the tiles 750a-750c while in contact with the reference surface 770, the reference surface 770 can be formed by or coated with a material that affects relative friction in a desired fashion. For example, a low coefficient of friction coating such as SAM (self-assembled monolayer) can be applied to the reference surface 770 to promote sliding of the tiles 750a-750c (e.g., low friction, sliding interface with the substrates 760a-760c) relative to the reference surface 770. Alternatively or in addition, one or more of the tiles substrates 760a-760c can have a coating or material that affects frictional interface with the reference surface 770 in a desired manner. In some embodiments, the reference sheet 752 can further include one or more registration features (not shown) arranged at locations corresponding with expected placement of the individual tiles 750a-750c relative to the reference surface 770. With these and related embodiments, methods of the present disclosure can optionally further include performing tile-to-reference surface alignment by aligning the alignment feature of the corresponding tile 750a-750c with a respective one of the registration features (e.g., coarse alignment of neighboring tiles can be performed via alignment with the registration features of the reference sheet 752, followed by fine alignment via alignment of the alignment features of the neighboring tiles).

Figure 15A:
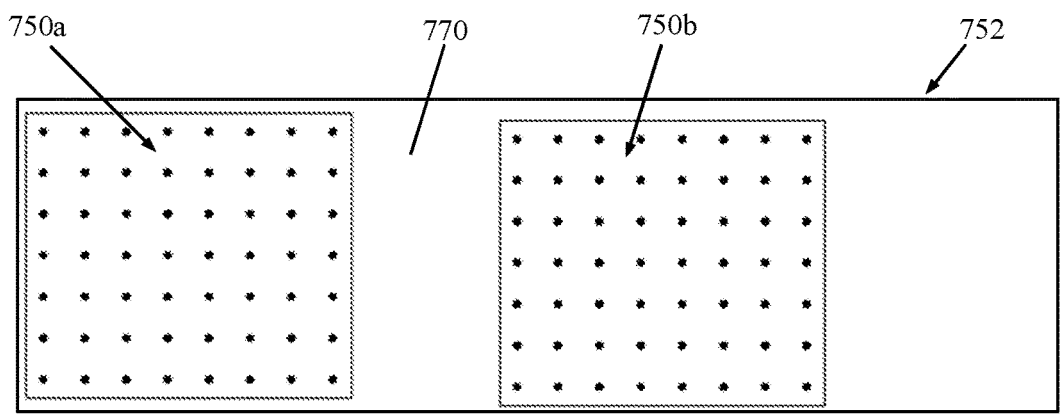
FIGS. 15A-15C illustrate methods of assembling a tiled display using the arrangement of FIG. 14.
Figure 15B:
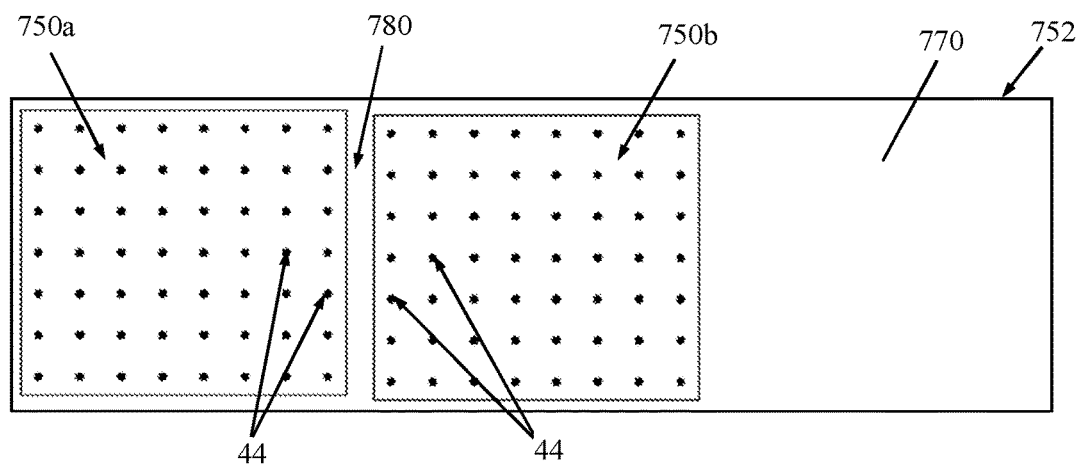
Figure 15C:
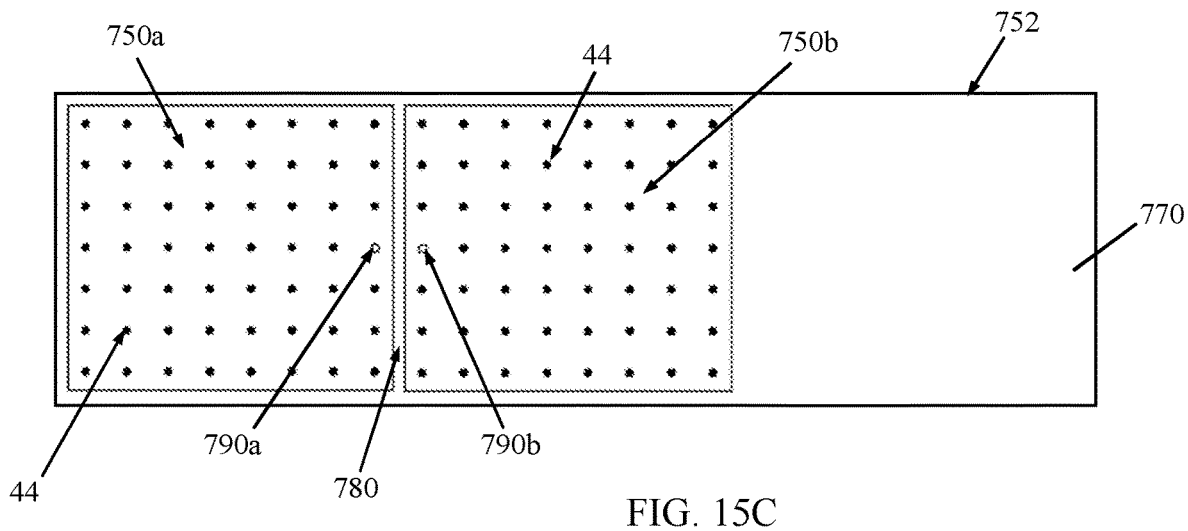

Some methods of tiled display assembly implicated by the above descriptions can include first placing tiles individually on the reference surface 770 and then aligning the tiles (and in particular the pixels), one-by-one, via the corresponding alignment features. For example, FIG. 15A depicts an initial stage of assembly in which the first and second tiles 750a, 750b have been placed onto the reference surface 770. In some embodiments, depending on the flexural rigidity of the tiles 750a, 750b (e.g., flexural rigidity of the corresponding substrates 760a, 760b (FIG. 14)), the tiles 750a, 750b can be introduced to the reference surface 770 in rolling/bent, vertical, horizontal or combined motion. Regardless, the second tile 750b is then manipulated (e.g., slid along the reference surface 770) relative to the first tile 750a (and/or vice-versa) such that the first and second tiles 750a, 750b neighbor one another with an edge of the first tile 750a facing an edge of the second tile 750b to generally establish the seam 780 there between as in FIG. 15B. As mentioned above, in some embodiments, coarse alignment of the tiles 750a, 750b can be made with reference to reference features (not shown) optionally provided with the reference sheet 752. The alignment feature(s) on the reference surface 770 can also be used for final tile alignment. Alternatively, in some embodiments, coarse alignment can be promoted by physical contact between edges of the tiles 750a, 750b. At this stage of assembly, the pixels 44 of the first and second tiles 750a, 750b may or may not be registered to one another. Additionally, the alignment features of the first and second tiles 750a, 750b are then aligned to register the pixels 44 of the first tile 750a with the pixels 44 of the second tile 750b. FIG. 15C, for example, illustrates an alignment feature 790a of the first tile 750a and an alignment feature 790b of the second tile 750b; the alignment features 790a, 790b of this non-limiting example are selected ones of the pixels 44 provided with the respective tiles 750a, 750b. The alignment features 790a, 790b are identified (e.g., the pixel(s) comprising each of the alignment features 790a, 790b are illuminated), and then aligned (e.g., optically aligned). Following this alignment step, the pixels 44 of the first and second tiles 750a, 750b are registered relative to one another, including a pixel pitch across the seam 780 corresponding with the uniform pixel pitch established at each of the tiles 750a, 750b. The third tile 750c (FIG. 14) can then be placed on the reference surface 770 and registered relative to the second tile 750b in a similar fashion. In other embodiments, multiple individual tiles can be placed on the reference surface 770 and then a mechanical/machine vision system used to perform alignment of the multiple tiles in a parallel assembly process. Overall, registration of the tiles 750a-750c can be performed by use of tile-to-tile alignment features and/or tile-to-references sheet alignment features.

Returning to FIG. 14, once aligned and registered, the tiles (e.g., the tiles 750a-750c) are fixed relative to one another to complete the tiled display 754. Where there tiles 750a-750c are assembled in a way that creates physical separation between them, the physical separation can then have polymeric or other physical spacer element that prevents mechanical contact as described above. In some embodiments, the reference sheet 752 can be configured for temporary use; once assembled over the reference sheet 752, the tiles 750a-750c can be adhered or otherwise fixed to one another and then be removed from the reference sheet 752. With these and similar techniques, the reference sheet 752 can assume a variety of forms and can be formed of various materials without concern for tiled display operation. In other embodiments, the reference sheet 752 can be configured to serve as a permanent part of the final tiled display 754, and thus can have appropriate mechanical, electrical and/or optical properties (e.g., the reference sheet 752 can serve as a cover sheet or plate of the tiled display and can be a strengthened glass). If the tiled display is a backlight, the reference sheet 752 can be the associated liquid crystal cell that extends over portions of at least two neighboring backlight tiles. In some embodiments, if a curved (non-flat) tiled display is desired, the tiled display 754 can be assembled while the reference sheet 752 is flat; after assembly of the tiled display 754, the reference sheet 752 can be cold bent to the desired shape to create a non-flat display. Alternatively, the reference sheet 752 can initially have a curved shape to which the tiles 750a-750c are assembled. The final curved display can have a radius of curvature of no greater than 0.1 m, alternatively not greater than 0.5 m, alternatively not greater than 1 m, alternatively not greater than 5 m, and in some embodiments not greater than 10 m. In addition to enabling registration and assembly of tiles in the X-Y plane, the reference surface 770 can also provide tile registration in the Z-direction. For example, the reference surface 770 can, in some embodiments, enable tile placement where neighboring tiles are offset in the Z-direction by no more than 50% of the tile substrate thickness, alternatively no more than 40%, alternatively no more than 30%, alternatively no more than 20%, alternatively no more than 10%, alternatively no more than 5%, and in some embodiments no more than 1%.

Various modifications and variations can be made the embodiments described herein without departing from the scope of the claimed subject matter. Thus it is intended that the specification cover the modifications and variations of the various embodiments described herein provided such modifications and variations come within the scope of the appended claims and their equivalents.

What is claimed is:

1. A tiled display having an array of pixels arranged in a plurality of rows and a plurality of columns, the tiled display comprising:
   a first tile comprising a substrate carrying a matrix of pixels arranged at a uniform pixel pitch, wherein:
      the substrate comprises opposing, first and second major faces and a first edge extending between the opposing major faces in a depth direction of the substrate,
      the matrix of pixels includes a first pixel located most proximate the first edge; and
   a second tile comprising a substrate carrying a matrix of pixels arranged at the uniform pixel pitch, the substrate of the second tile comprising opposing major faces and a first edge extending in a depth direction of the substrate of the second tile: wherein
   the first edges have a complementary shape; and
   final assembly of the tiled display includes:
      the first edges facing one another to establish a first seam therebetween, pixels of the first tile are registered with pixels of the second tile and the uniform pixel pitch is maintained across the first seam in a designated linear direction,
      the first pixel is aligned within a first row of the plurality of rows and a first column of the plurality of columns,
      the pixels of the second tile are not interposed between pixels of the first tile along either of the first row or the first column;
      the complementary shape comprises at least one feature selected from the group consisting of: at least a segment of the first seam is oblique to the plurality of rows, and the first edge of the first tile is profiled in the depth direction such that at least a section of the first edge of the first tile is non-perpendicular to a plane of the corresponding opposing major faces,
      the first edge of the first tile forms an obtuse angle with the corresponding first major face and an acute angle with the corresponding second major face, and
      the first edge of the second tile forms an acute angle with the corresponding first major face and an obtuse angle with the corresponding second major face.

2. The tiled display of claim 1, wherein the substrate of the first tile further comprises a second edge extending between the corresponding major faces, the second edge forming a corner with the first edge of the first tile, and further wherein the matrix of pixels of the first tile further comprises a second pixel located most proximate the second edge, the tiled display further comprising:
   a third tile comprising a substrate carrying a matrix of pixels arranged at the uniform pixel pitch, the substrate of the third tile comprising opposing major faces and a first edge extending between the corresponding major faces;
   wherein the second edge of the first tile and the first edge of the third tile have a complementary shape;
   and further wherein final assembly of the tiled display includes:
      the second edge of the first tile and the first edge of the third tile facing one another to establish a second seam there between,
      pixels of the first tile registered with pixels of the third tile and the uniform pixel pitch is maintained across the second seam in the designated linear direction.

3. The tiled display of claim 2, wherein the complementary shape of the second edge of the first tile and the first edge of the third tile comprises at least one feature selected from the group consisting of:
   at least a segment of the second seam is oblique to the plurality of rows; and
   the second edge of the first tile and the first edge of the third tile are each profiled in the depth direction such that at least a section of each of the second edge of the first tile and the first edge of the third tile is non-perpendicular to a plane of the corresponding opposing major faces.

4. The tiled display of claim 2, wherein the substrate of the second tile and the substrate of the third tile each further comprise a second edge, wherein the second edges of the first and second tiles have a complementary shape, and further wherein final assembly of the tiled display includes:
   the second edge of the second tile and the second edge of the third tile facing one another to establish a third seam there between; and
   pixels of the second tile registered with pixels of the third tile and the uniform pixel pitch is maintained across the third seam in the designated linear direction.

5. The tiled display of claim 4, wherein the complementary shape of the second edge of the second tile and the second edge of the third tile comprises at least one feature selected from the group consisting of:
   at least a segment of the third seam is oblique to the plurality of rows; and
   the second edge of the second tile and the second edge of the third tile are each profiled in the depth direction such that at least a section of each of the second edge of the second tile and the second edge of the third tile is non-perpendicular to a plane of the corresponding opposing major faces.

6. The tiled display of claim 1, wherein the segment of the first seam is non-linear.

7. The tiled display of claim 1, wherein each of the first edges is non-linear in a plane parallel with a plane of the corresponding opposing major faces.

8. The tiled display of claim 1, wherein the first seam is linear.

9. The tiled display of claim 8, wherein an entirety of the first seam is oblique to the plurality of rows.

10. The tiled display of claim 1, wherein the first edge of the first tile forms an obtuse angle with the corresponding first major face and an acute angle with the corresponding second major face.

11. The tiled display of claim 10, further comprising a frame element disposed within the first seam, separating the first edge of the first tile from the first edge of the second tile.

12. The tiled display of claim 1, wherein final assembly of the tiled display includes the first edge of the first tile parallel with the first edge of the second tile.

13. The tiled display of claim 1, wherein the first edge of the first tile is curved between the corresponding opposing major faces, and further wherein the first edge of the second tile is linear between the corresponding opposing major faces.

14. The tiled display of claim 1, wherein the first edges comprise complementary stepped shapes.

15. The tiled display of claim 1, wherein the first edge of the first tile defines a notch, and further wherein the first edge of the second tile defines a rib, and even further wherein the final assembly of the tiled display comprises the rib aligned with the notch.

16. The tiled display of claim 1, further comprising a spacer disposed between the first edge of the first tile and the first edge of the second tile.

17. The tiled display of claim 16, wherein the spacer comprises a polymeric material.

18. The tiled display of claim 1, wherein the first major face of the substrate of the first tile comprises at least one of a groove and a bump for mounting to a base plate.

19. The tiled display of claim 1, wherein the uniform pixel pitch is not greater than 0.5 mm.

20. The tiled display of claim 19, wherein the uniform pixel pitch is not greater than 0.4 mm.

21. The tiled display of claim 20, wherein the uniform pixel pitch is not greater than 0.3 mm.

22. The tiled display of claim 1, wherein the first tile further comprises a plurality of micro-LEDs.

23. The tiled display of claim 1, wherein final assembly of the tiled display includes pixels of the first tile registered with pixels of the second tile at a registration error of not greater than 50% of the uniform pixel pitch in the designated linear direction.

24. The tiled display of claim 1, wherein the substrate of the first tile comprises a material selected from the group consisting of glass, glass ceramic, and ceramic.

25. The tiled display of claim 1, wherein the substrate of the first tile exhibits a coefficient of thermal expansion of not greater than 10 ppm/° C.

26. The tiled display of claim 1, wherein the substrate of the first tile exhibits a Young's modulus of not less than 50 GPa.

27. A tiled display having an array of pixels arranged in a plurality of rows and a plurality of columns, the tiled display comprising:
    a first tile comprising a substrate carrying a matrix of pixels arranged at a uniform pixel pitch, wherein:
        the substrate comprises opposing, first and second major faces and a first edge extending between the opposing major faces in a depth direction of the substrate,
        the matrix of pixels includes a first pixel located most proximate the first edge; and
    a second tile comprising a substrate carrying a matrix of pixels arranged at the uniform pixel pitch, the substrate of the second tile comprising opposing major faces and a first edge extending in a depth direction of the substrate of the second tile: wherein
    the first edges have a complementary shape; and
    final assembly of the tiled display includes:
        the first edges facing one another to establish a first seam therebetween, pixels of the first tile are registered with pixels of the second tile and the uniform pixel pitch is maintained across the first seam in a designated linear direction,
        the first pixel is aligned within a first row of the plurality of rows and a first column of the plurality of columns,
        the pixels of the second tile are not interposed between pixels of the first tile along either of the first row or the first column;
    the complementary shape comprises at least one feature selected from the group consisting of: at least a segment of the first seam is oblique to the plurality of rows, and the first edge of the first tile is profiled in the depth direction such that at least a section of the first edge of the first tile is non-perpendicular to a plane of the corresponding opposing major faces, and
    the substrate of the first tile comprises a material selected from the group consisting of glass, glass ceramic, and ceramic.

28. The tiled display of claim 27, wherein the substrate of the first tile further comprises a second edge extending between the corresponding major faces, the second edge forming a corner with the first edge of the first tile, and further wherein the matrix of pixels of the first tile further comprises a second pixel located most proximate the second edge, the tiled display further comprising:
    a third tile comprising a substrate carrying a matrix of pixels arranged at the uniform pixel pitch, the substrate of the third tile comprising opposing major faces and a first edge extending between the corresponding major faces;
    wherein the second edge of the first tile and the first edge of the third tile have a complementary shape;
    and further wherein final assembly of the tiled display includes:
        the second edge of the first tile and the first edge of the third tile facing one another to establish a second seam there between,
        pixels of the first tile registered with pixels of the third tile and the uniform pixel pitch is maintained across the second seam in the designated linear direction.

29. The tiled display of claim 28, wherein the complementary shape of the second edge of the first tile and the first edge of the third tile comprises at least one feature selected from the group consisting of:
    at least a segment of the second seam is oblique to the plurality of rows; and
    the second edge of the first tile and the first edge of the third tile are each profiled in the depth direction such that at least a section of each of the second edge of the first tile and the first edge of the third tile is nonperpendicular to a plane of the corresponding opposing major faces.

30. The tiled display of claim 28, wherein the substrate of the second tile and the substrate of the third tile each further comprise a second edge, wherein the second edges of the first and second tiles have a complementary shape, and further wherein final assembly of the tiled display includes:
    the second edge of the second tile and the second edge of the third tile facing one another to establish a third seam there between; and
    pixels of the second tile registered with pixels of the third tile and the uniform pixel pitch is maintained across the third seam in the designated linear direction.

31. The tiled display of claim 30, wherein the complementary shape of the second edge of the second tile and the second edge of the third tile comprises at least one feature selected from the group consisting of:
    at least a segment of the third seam is oblique to the plurality of rows; and
    the second edge of the second tile and the second edge of the third tile are each profiled in the depth direction such that at least a section of each of the second edge of the second tile and the second edge of the third tile is non-perpendicular to a plane of the corresponding opposing major faces.

32. The tiled display of claim 27, wherein the segment of the first seam is non-linear.

33. The tiled display of claim 27, wherein each of the first edges is non-linear in a plane parallel with a plane of the corresponding opposing major faces.

34. The tiled display of claim 27, wherein the first seam is linear.

35. The tiled display of claim 34, wherein an entirety of the first seam is oblique to the plurality of rows.

36. The tiled display of claim 27, wherein the first edge of the first tile forms an obtuse angle with the corresponding first major face and an acute angle with the corresponding second major face.

37. The tiled display of claim 36, wherein the first edge of the first tile forms an obtuse angle with the corresponding first major face and an acute angle with the corresponding second major face.

38. The tiled display of claim 37, further comprising a frame element disposed within the first seam, separating the first edge of the first tile from the first edge of the second tile.

39. The tiled display of claim 36, wherein the first edge of the second tile forms an acute angle with the corresponding first major face and an obtuse angle with the corresponding second major face.

40. The tiled display of claim 39, wherein final assembly of the tiled display includes the first edge of the first tile parallel with the first edge of the second tile.

41. The tiled display of claim 27, wherein the first edge of the first tile is curved between the corresponding opposing major faces, and further wherein the first edge of the second tile is linear between the corresponding opposing major faces.

42. The tiled display of claim 27, wherein the first edges comprise complementary stepped shapes.

43. The tiled display of claim 27, wherein the first edge of the first tile defines a notch, and further wherein the first edge of the second tile defines a rib, and even further wherein the final assembly of the tiled display comprises the rib aligned with the notch.

44. The tiled display of claim 27, further comprising a spacer disposed between the first edge of the first tile and the first edge of the second tile.

45. The tiled display of claim 44, wherein the spacer comprises a polymeric material.

46. The tiled display of claim 27, wherein the first major face of the substrate of the first tile comprises at least one of a groove and a bump for mounting to a base plate.

47. The tiled display of claim 27, wherein the uniform pixel pitch is not greater than 0.5 mm.

48. The tiled display of claim 47, wherein the uniform pixel pitch is not greater than 0.4 mm.

49. The tiled display of claim 48, wherein the uniform pixel pitch is not greater than 0.3 mm.

50. The tiled display of claim 27, wherein the first tile further comprises a plurality of micro-LEDs.

51. The tiled display of claim 27, wherein final assembly of the tiled display includes pixels of the first tile registered with pixels of the second tile at a registration error of not greater than 50% of the uniform pixel pitch in the designated linear direction.

52. The tiled display of claim 27, wherein the substrate of the first tile exhibits a coefficient of thermal expansion of not greater than 10 ppm/° C.

53. The tiled display of claim 27, wherein the substrate of the first tile exhibits a Young's modulus of not less than 50 GPa.

* * * * *